United States Patent [19]

Hammond et al.

[11] Patent Number: 4,884,021

[45] Date of Patent: Nov. 28, 1989

[54] DIGITAL POWER METERING

[75] Inventors: Scott H. Hammond, Columbus; Ronald L. Kirk, Findlay; Eric R. Francis, Columbus, all of Ohio

[73] Assignee: TransData, Inc., Tyler, Tex.

[21] Appl. No.: 258,089

[22] Filed: Oct. 14, 1988

Related U.S. Application Data

[63] Continuation of Ser. No. 42,306, Apr. 27, 1987, abandoned.

[51] Int. Cl.⁴ .................. G01R 21/06; G01F 15/20
[52] U.S. Cl. .................................... 324/142; 324/116; 324/141; 364/483
[58] Field of Search ............... 324/142, 76 R, 141, 324/116; 340/637, 657; 364/483, 481

[56] References Cited

U.S. PATENT DOCUMENTS

| | | | |
|---|---|---|---|
| 4,077,061 | 2/1978 | Johnston et al. | 364/483 |
| 4,080,568 | 3/1978 | Funk | 364/483 X |
| 4,345,311 | 8/1982 | Fielden | 324/142 X |
| 4,371,943 | 2/1983 | Woods et al. | 364/483 X |
| 4,459,546 | 7/1984 | Arrington et al. | 324/142 X |
| 4,615,009 | 9/1986 | Battocletti et al. | 364/483 X |
| 4,672,555 | 6/1987 | Hart et al. | 324/142 X |

FOREIGN PATENT DOCUMENTS

| | | |
|---|---|---|
| 008630 | 3/1980 | European Pat. Off. . |
| 57978 | 8/1982 | European Pat. Off. . |
| 201019 | 11/1986 | European Pat. Off. . |
| 2381317 | 9/1978 | France . |

OTHER PUBLICATIONS

Electrical World, vol. 78, No. 9, Nov. 1, 1972, pp. 84-86, IEEE Transactions on Industrial Electr. & Control Inst., vol. IECI-28 No. 3, Aug. 1981, pp. 180-184.
IEEE Instrumentation and Measurement Conference, Boulder, Colo., 25-27, Mar. 1986, pp. 243-245.

Primary Examiner—Reinhard J. Eisenzopf
Assistant Examiner—Vinh P. Nguyen
Attorney, Agent, or Firm—Mueller and Smith

[57] ABSTRACT

Method and apparatus for metering polyphase power sources in which cycles for each phase are sampled at each degree and converted to a binary representation of amplitude. Sampling commences with a zero cross-over and a first digital conversion provides range data for developing scaling factors which are retained in memory and for providing a selective gain for amplifying. The scaling factor and the range data then are multipled to develop a digital representation of the sample amplitude which may have as many as 21 significant bits plus a sign bit. These expanded data valuations for current and voltage then are selectively multiplied for each degree sampled to develop data available for generation of 12 electrical parameter outputs. Generally, six of these outputs will be elected by the user. Volt amperes are computed with respect to the zero cross-over events for both voltage and current samples, while quantities such as Q and var are developed by selective delayed multiplication of the unit degree samples.

43 Claims, 16 Drawing Sheets

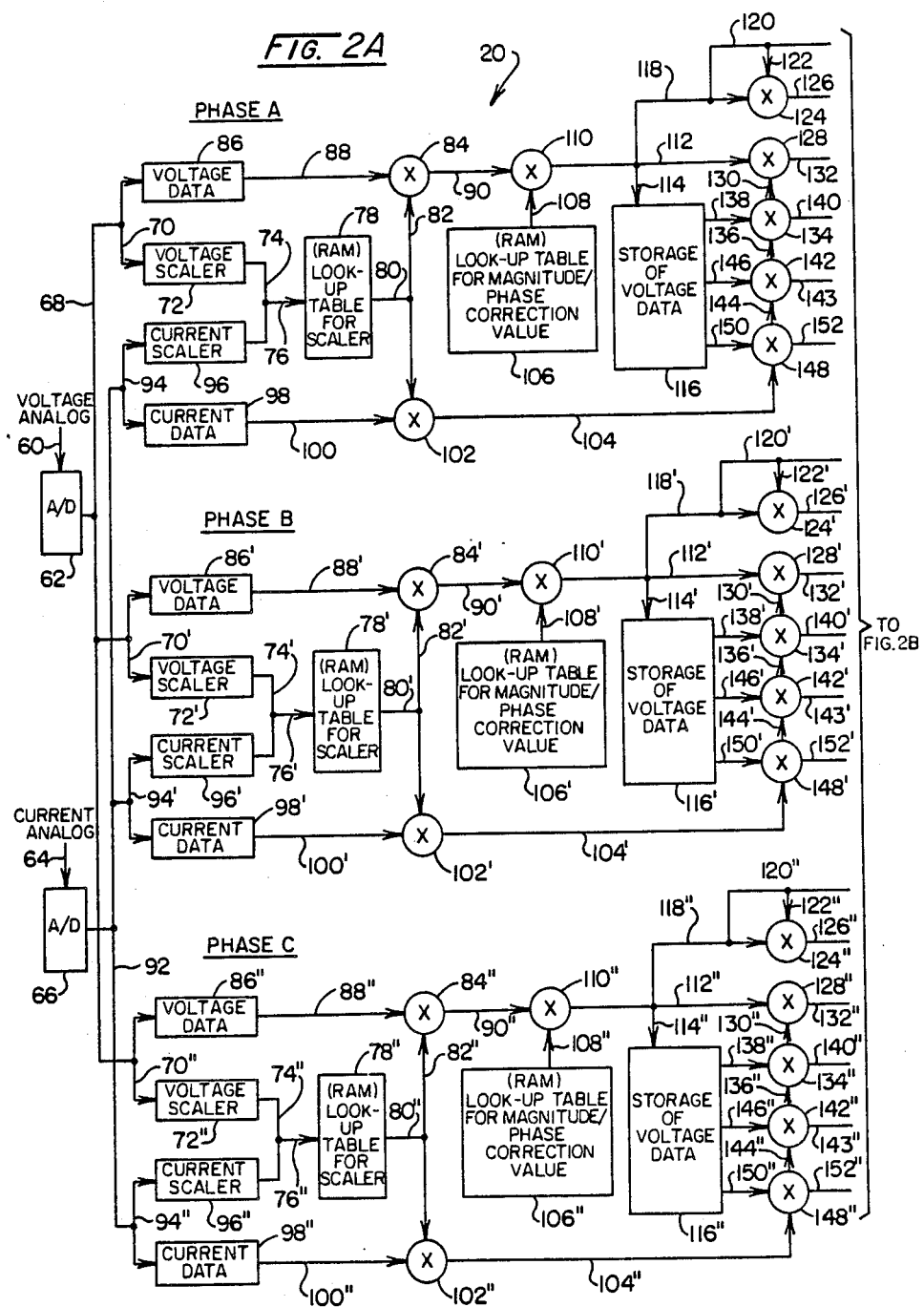

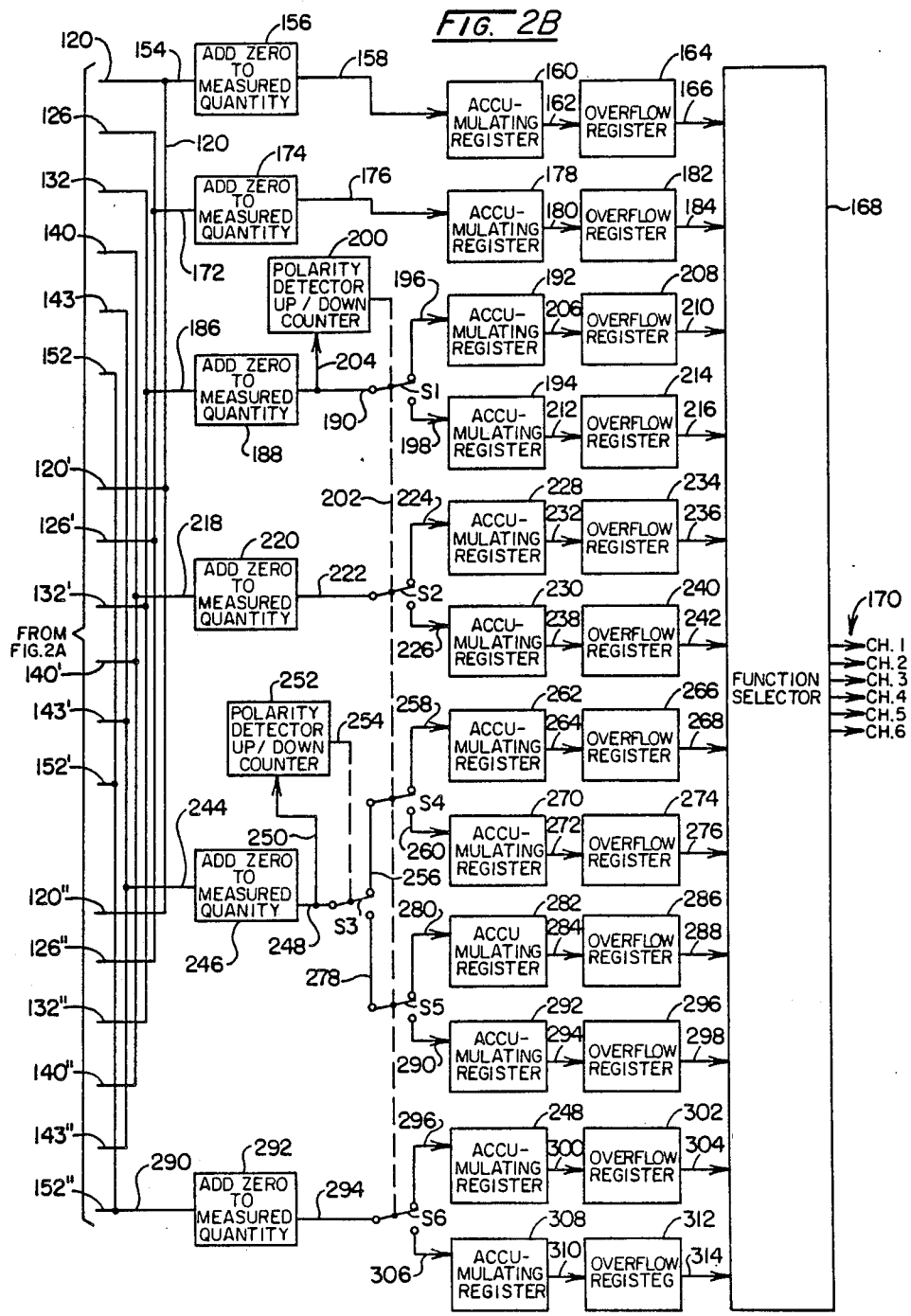

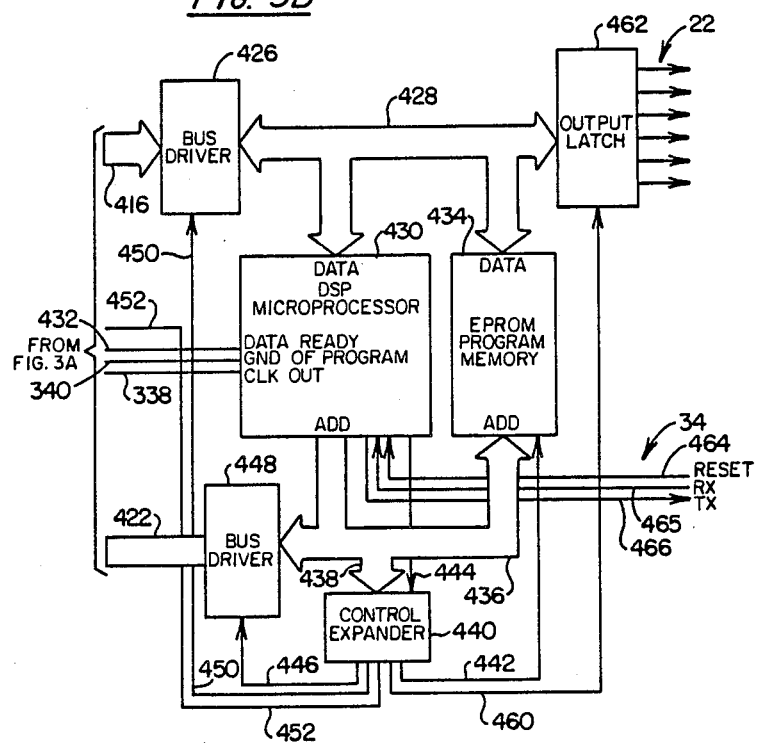

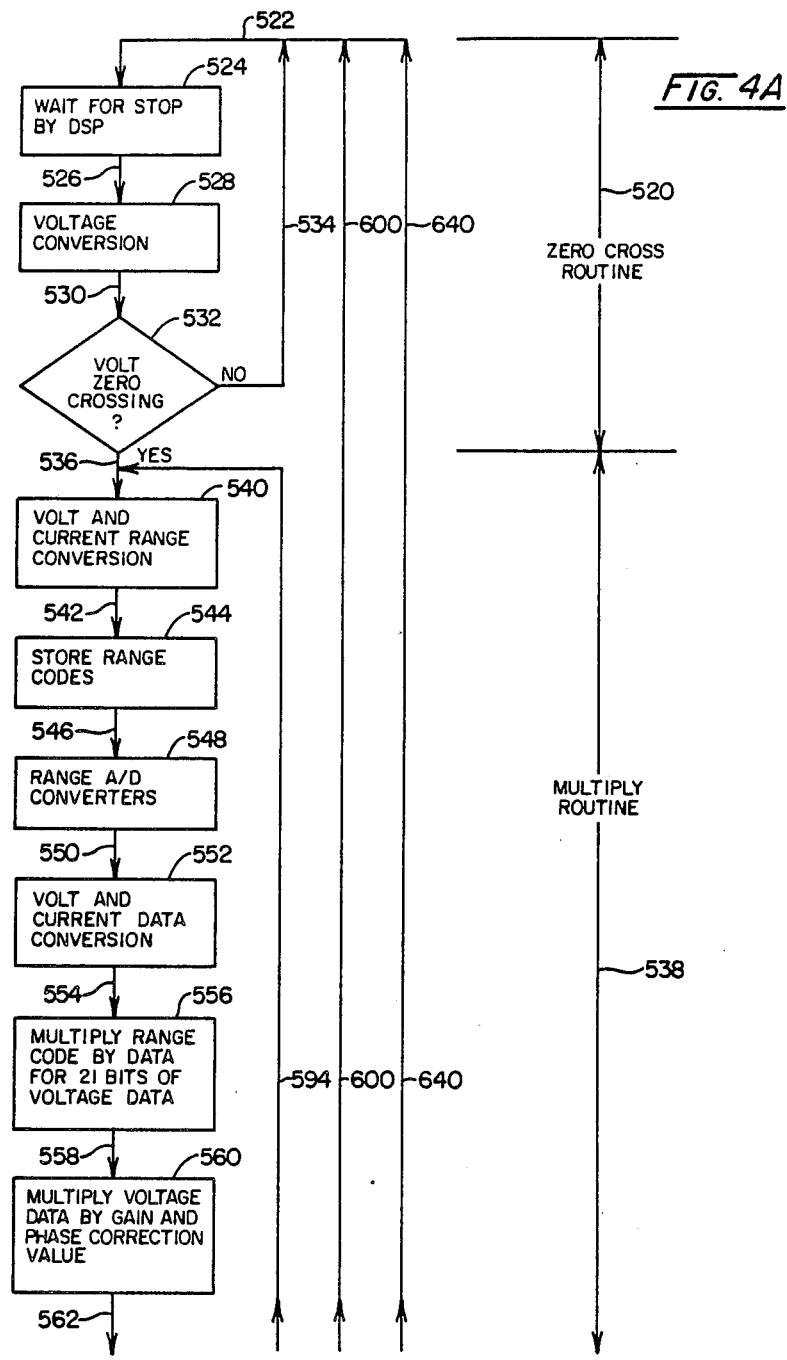

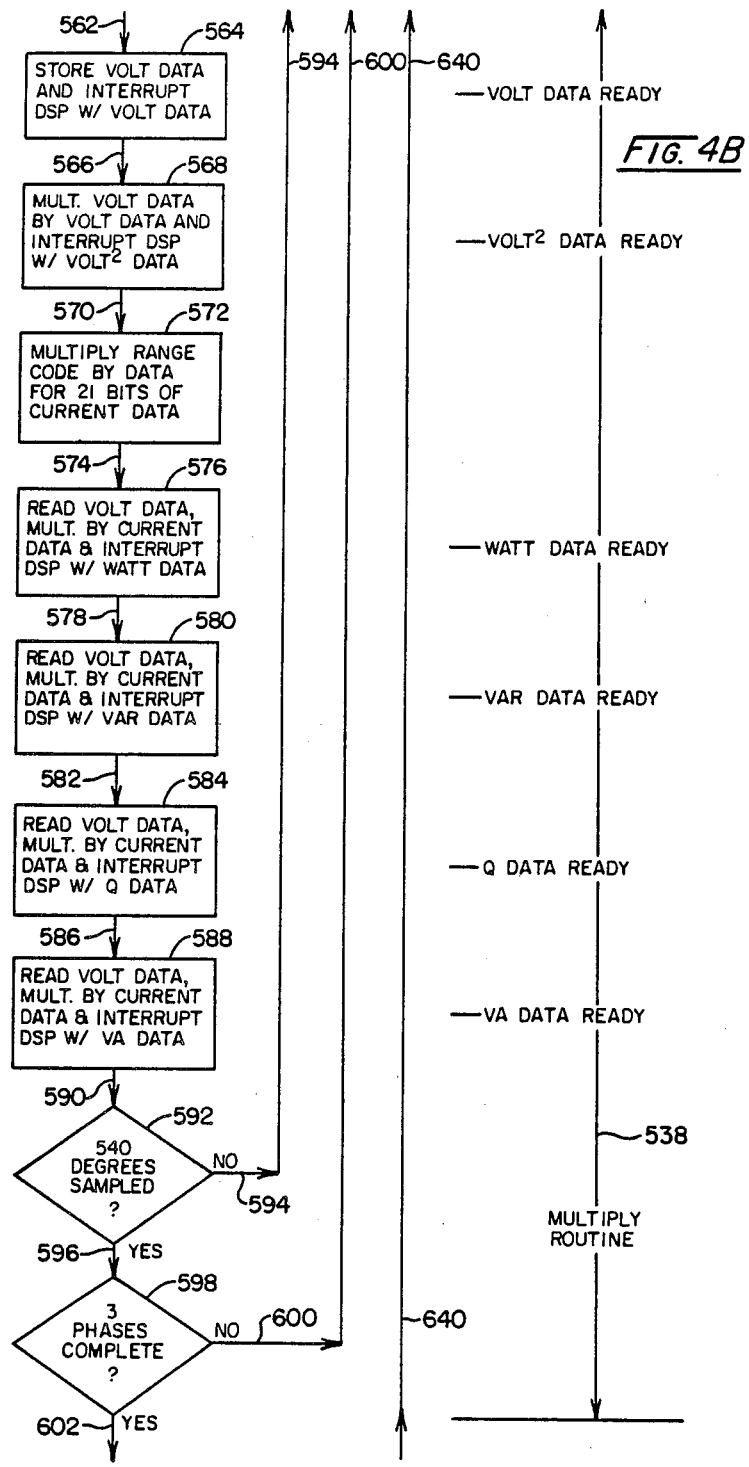

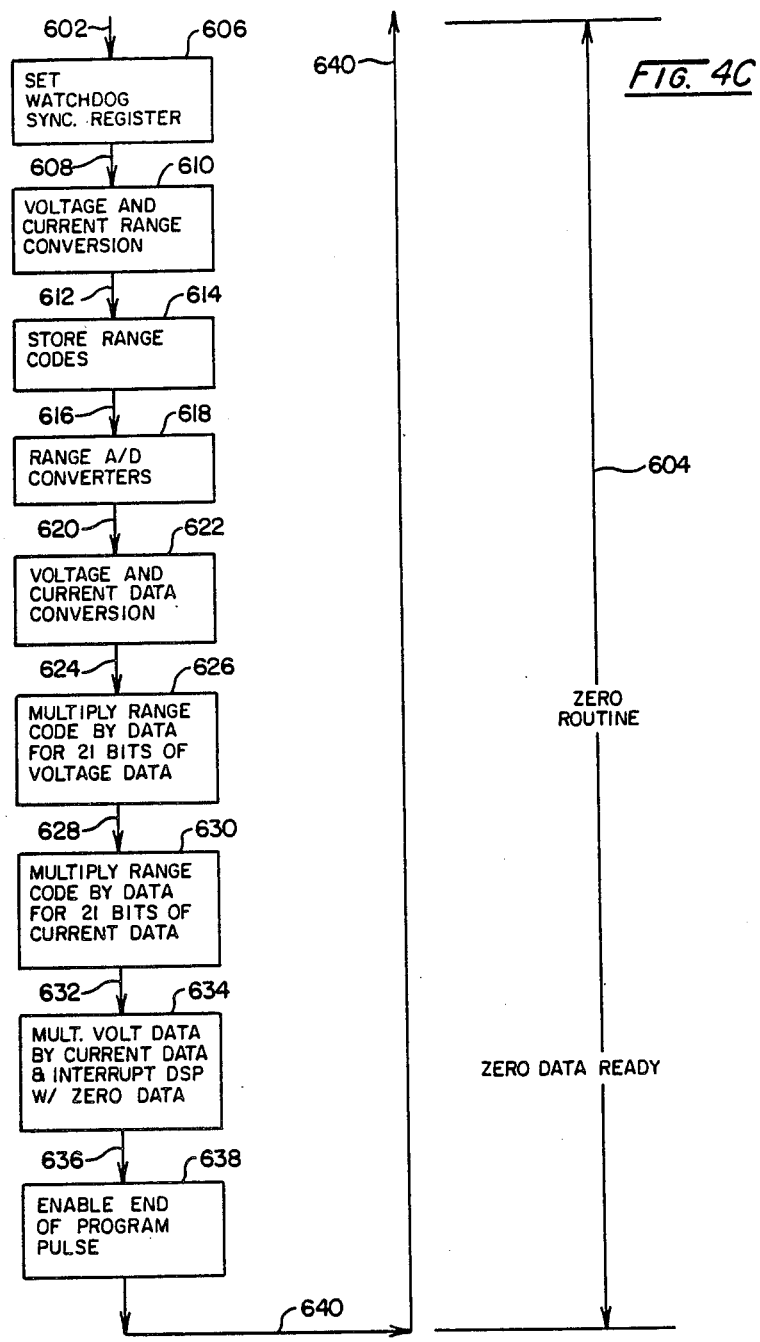

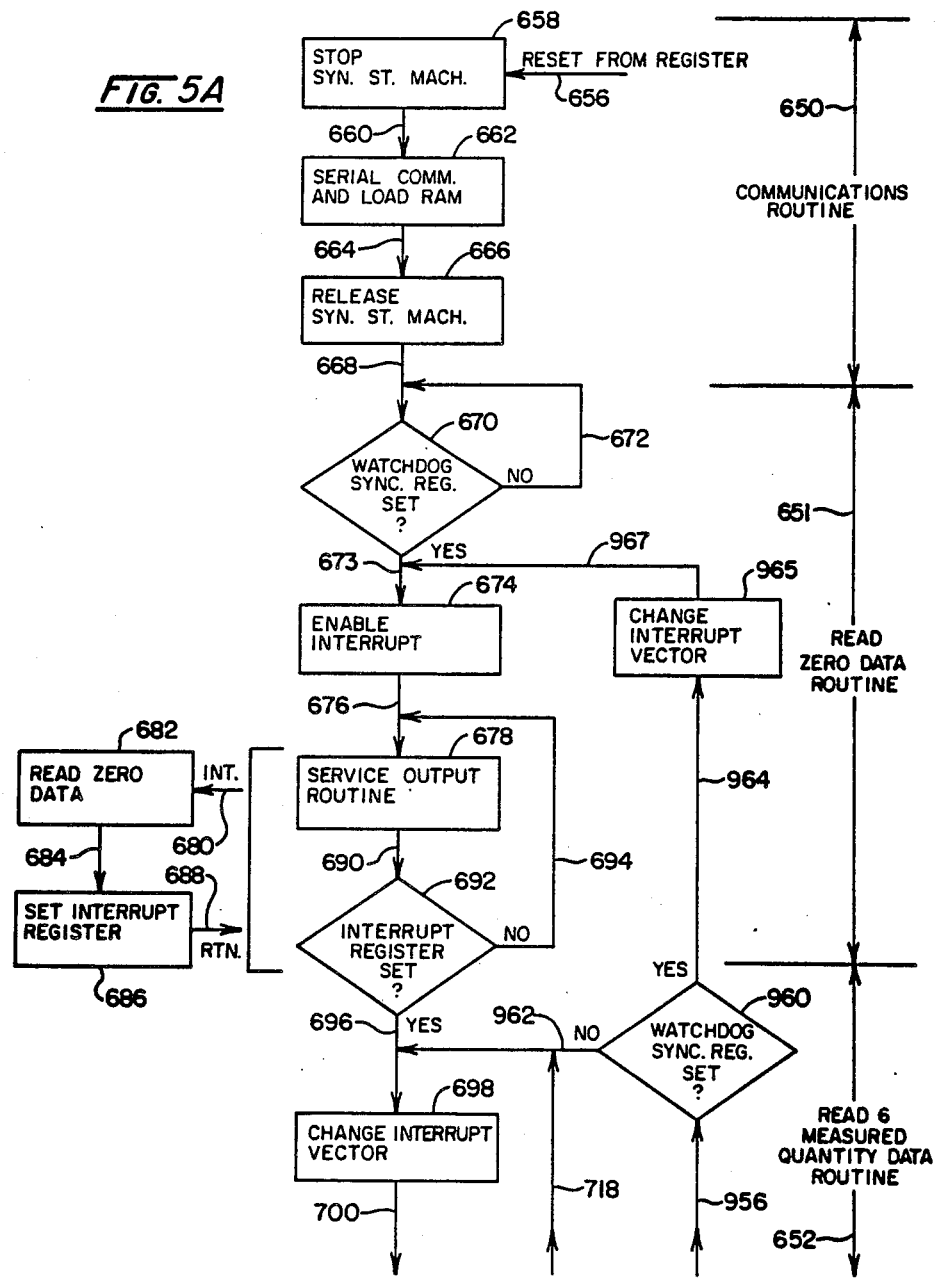

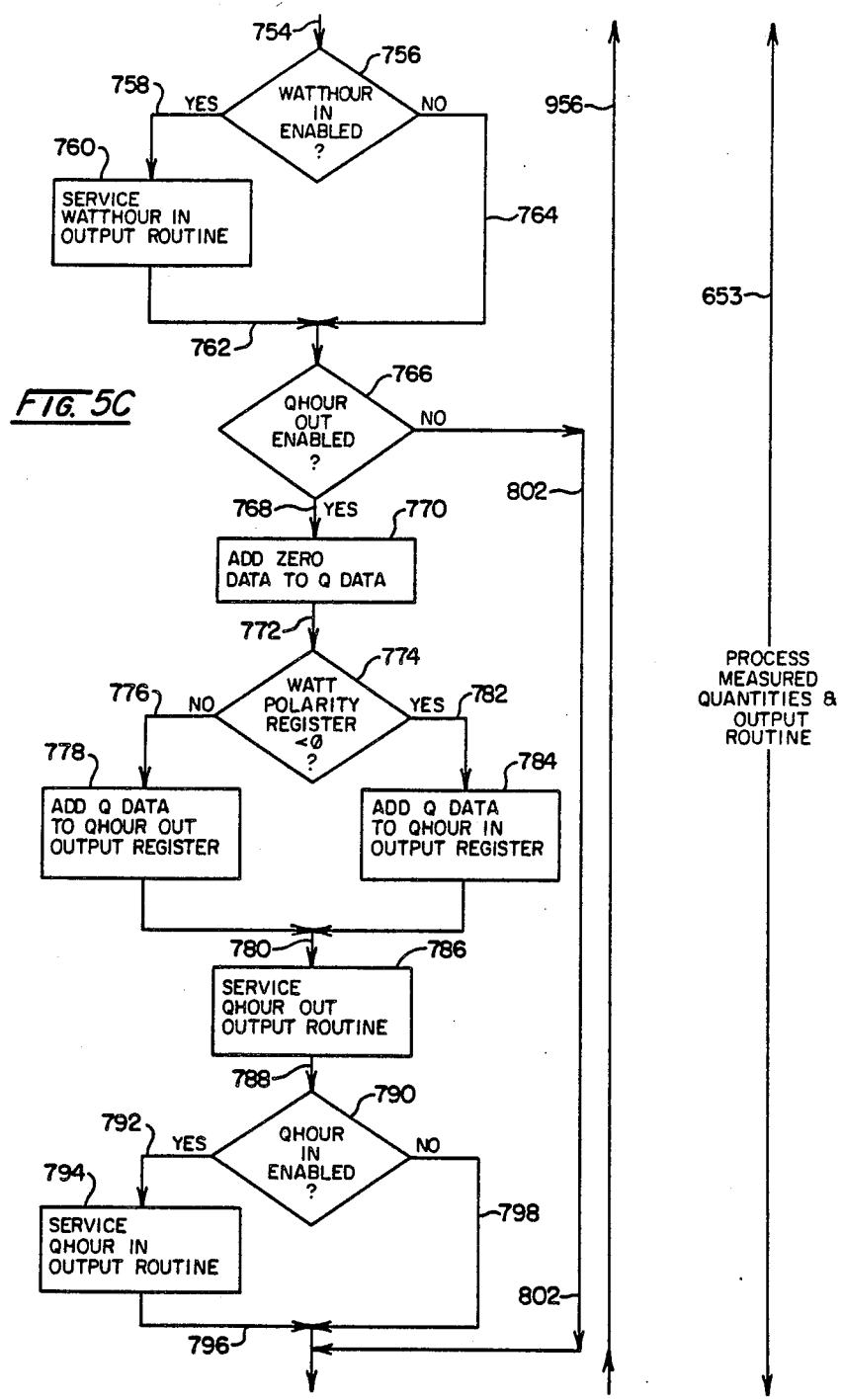

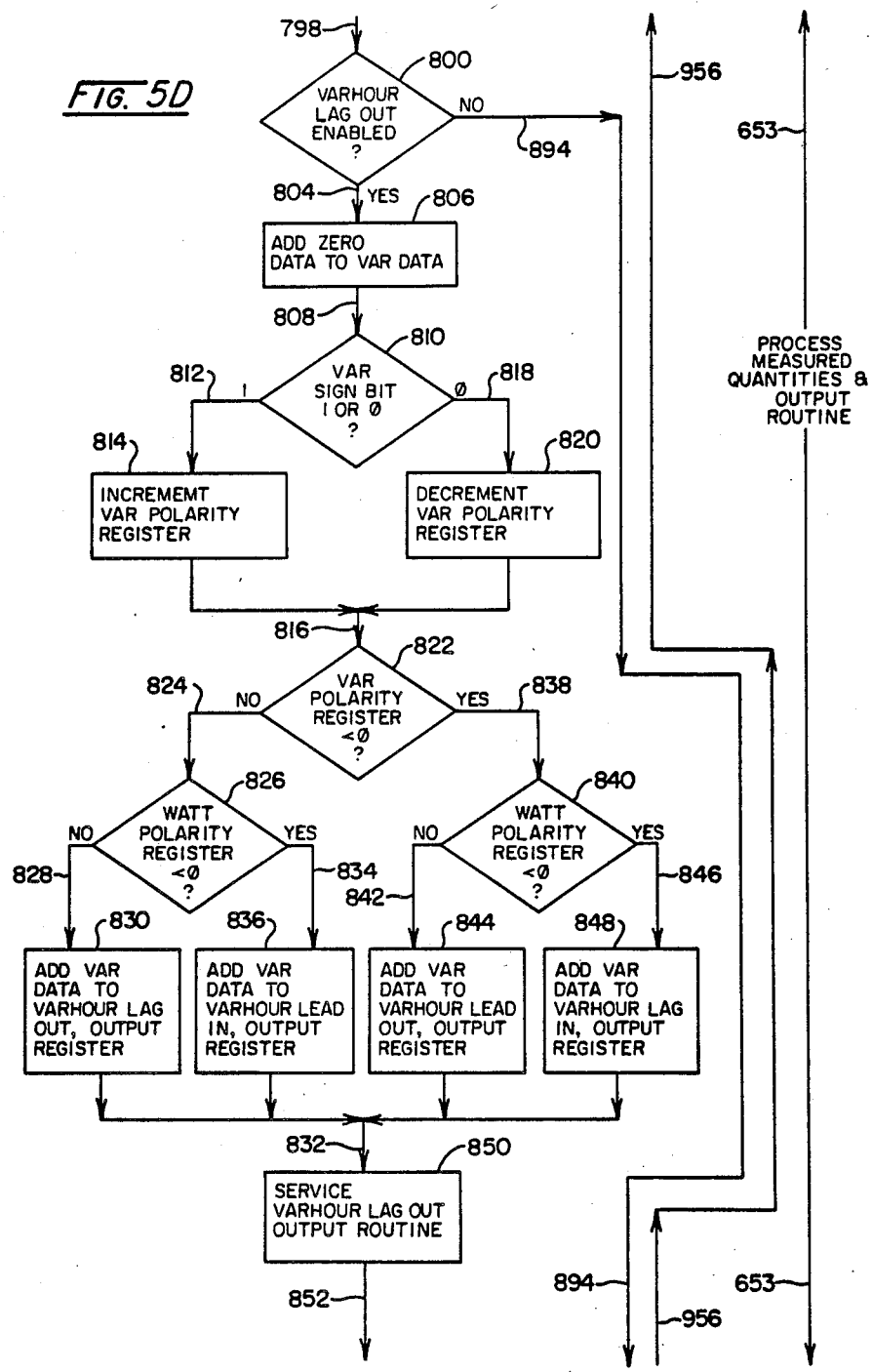

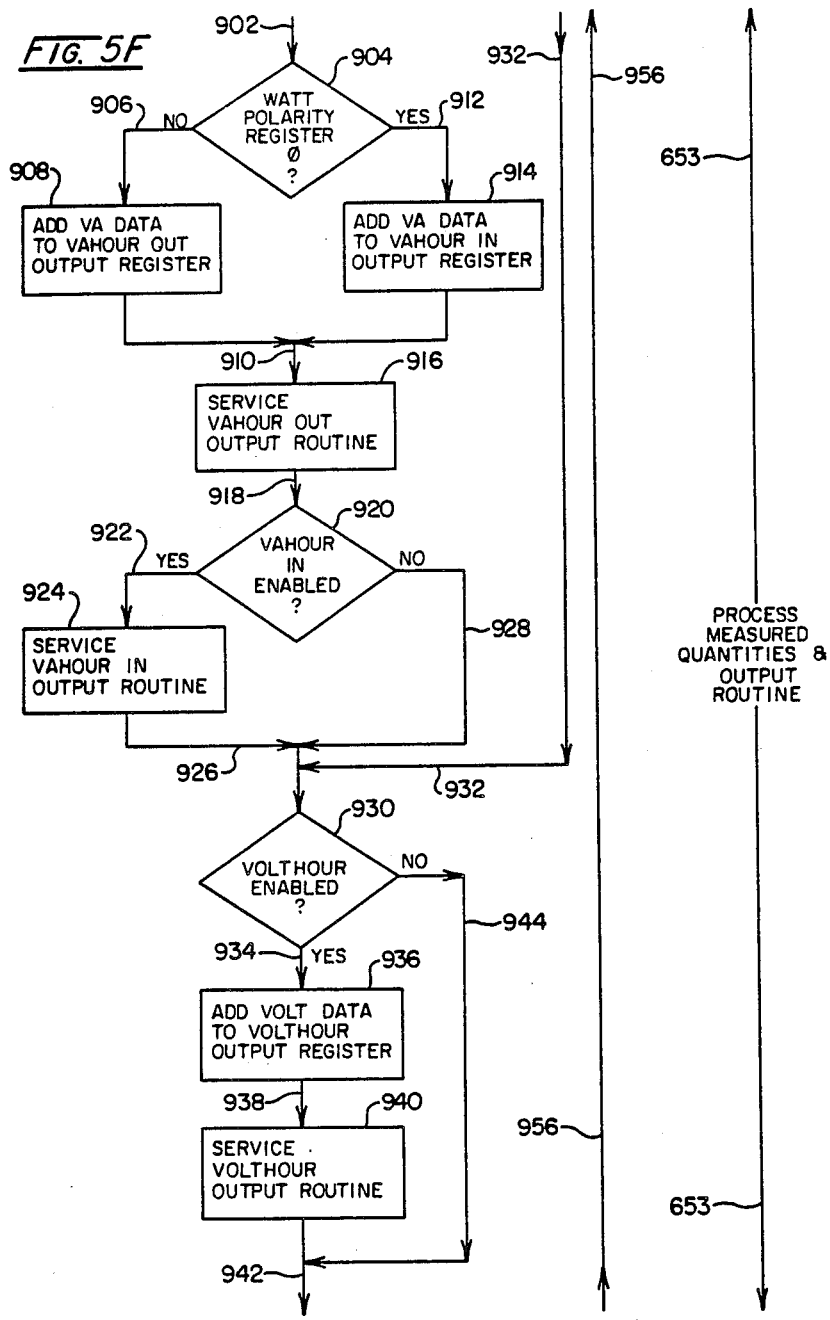

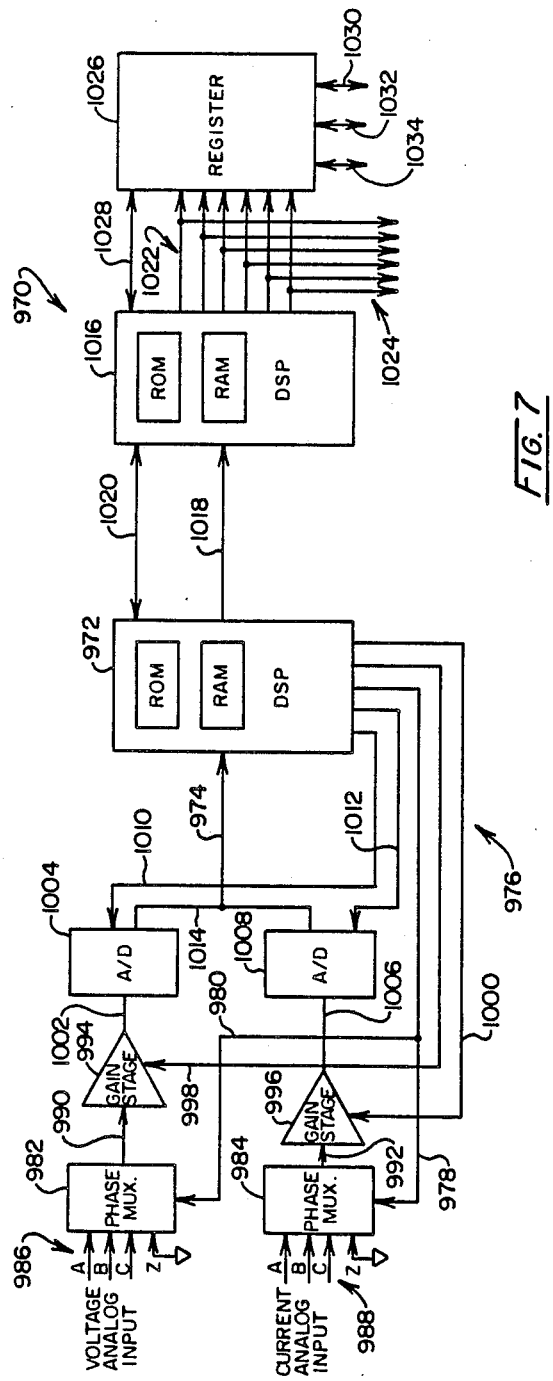

DIGITAL POWER METERING

This application is a continuation of application Ser. No. 042,306, filed Apr. 24, 1987, now abandoned.

BACKGROUND

Electrical utilities and principal power consuming industries have employed a variety of metering approaches to provide quantitative and qualitative evaluation of electrical power. The outputs provided by such metering systems vary to suit the particular needs of the user, selection of read-outs generally being made from the parameters including volthours, volt$^2$ hours, watt-hours, Qhours, varhours, and VA hours. These quantities are designated as in or out depending upon the direction of current flow, the term "out" representing delivery to the user and the term "in" representing return of power to the generating entity.

Typically, a metering system monitors power supplied through isolation and scaling components to derive polyphase input representations of voltage and current. These basic inputs then are selectively treated to derive units of power and the like as above listed. The most extensively employed technique has been the measurement of watthours through the use of an electromechanical induction meter. However, such devices are limited and thus, there have developed electronic analog techniques for carrying out multiplication and phase adjustment to achieve higher accuracies and a multitude of readouts.

Early analog approaches taken to provide power parameter outputs initially involved the use of thermally responsive coil elements and the like, the temperatures of which could be converted to outputs corresponding with power values. A lack of convenience and accuracy with such techniques lead to interest in the utilization of Hall effect devices as multipliers wherein voltage-proportional generated magnetic field and current were associated to provide a voltage output proportional to the product of current and voltage. Other devices have been developed which utilize an electronic arrangement serving to capitalize on the exponential transfer characteristic of solid-state devices to carry out multiplication. In general, these early analog multiplication techniques were somewhat unsatisfactory in exhibiting inaccuracies lower than desired as well as instabilities.

Another analog multiplier technique currently popular in the industry utilizes the system concept of time division multiplication. For example, the multiplier produces a pulse waveform whose amplitude is proportional to one variable, whose length relative to period is a function of another variable, and whose average value is proportional to the product of the two values. A variety of improvements in such time division multiplier circuits have been developed with respect to controlling phase and phase derived inaccuracies. Such improvements, for example, are described in U.S. Pat. Nos. 4,356,446, issued October 26, 1982; and 4,408,283, issued October 4, 1983; both assigned to the Assignee of this invention.

Analog approaches to electrical parameter monitoring and multiplication techniques physically are beset with problems in achieving desired output accuracy. Accurate drift-free analog multipliers are somewhat expensive and generally exhibit undesirable drift and component variations from device to device. Accordingly, a considerable amount of technical effort is required in their production and maintenance to provide for adjustment for these various inadequacies. As a consequence of these deficiencies, other approaches have been contemplated by investigators. For example, should the line inputs be purely sinusoidal, then straightforward peak detection techniques associated with mathmatical evaluation would be available. However, the line inputs experienced worldwide, while basically resembling sinusoids, exhibit substantial variations representing high and low frequency noise, high energy transients and a multitude of variations. These variations generally are caused by any of a number of external phenomena, for example, rapidly changing loads developed from solid-state controllers such as silicon controlled rectifier driven devices. In effect, portions of the waveform may be essentially missing due to high speed switching at loads.

Purely digital approaches to measuring electric power have been contemplated as ideal. With such an arrangement, for example, high rates of sampling may be employed and the instantaneous sample values then may be converted or digitized as binary values. This ideal approach generally has been considered to require very high speed systems either unavailable or of such cost and complexity as to preclude utilization for the instant purpose. However, this idealized approach promises to avoid degradation of accuracy occuring due to component variations and drift phenomenon and environmental effects.

As a compromise to the above ideal high speed sampling, relatively slow sampling techniques, i.e. on the order of each 45° of a cycle, have been proposed. To regain accuracy, such sampling is randomized. When using such randomized data, the approaches then must employ an averaging of the sampled values and thus, the advantages of high sample rate, instantaneous evaluation of waveform are not achieved nor can the systems distinguish discrete vagaries in distorted sinusoids. A typical randomizing approach is described, for example, in U.S. Pat. No. 4,077,061, issued February 28, 1978.

A further design aspect which has impeded the development of practical digital multiplication circuits resides in the somewhat limited range output of analog-to-digital conversion devices. Those available at practical cost, for example, provide a 12-bit output which generally will be found to be inadequate to achieve the scale of accuracy desired by industry. This particularly is true for those portions of a given sinusoid cycle which are of relatively lower amplitude as the cycle approaches cross-over. It is important that these lower level amplitudes be evaluated at high resolution accuracies for the approach to be practical. Some techniques for improving evaluation accuracies at lower amplitude have employed compressed scales to maximize resolution at lower levels. However, the full range bit resolution for such approaches remains unsatisfactory and complex and time demanding software overhead generally is consumed to accommodate to the compressed scaling.

Notwithstanding the foregoing, should a practical digital approach with high speed sampling be achieved, such system still must be capable of measuring all of the above-listed electrical parameters. Further, the technique must have reasonable accuracy such that from a system approach including all scaling components involving transformers, resistors and the like operation within an allowable error of ±0.09% of input, ±0.005% of rated input. Further, the multiplier electronics should be capable of performance within ±0.06% of input, ±0.005% of rated input. Thus, an allowable error of ±0.03% would be available for the input analog or scaling portion of any such device. Further, these systems should exhibit a reasonable dynamic operating range such as ±20% nominal voltage input, 0.025 to 200% of nominal current input and any power factor. Additionally, such system should be operable in conjunction with either single or polyphase power systems. This requires an approach involving a single phase metering technique such that single or polyphase calibration procedures may be employed. Thus, such system may not rely on the 120° phase separation of three phase systems.

SUMMARY

The present invention is addressed to a method and apparatus for metering power supplies wherein advantageous high speed sampling of the electrical parameters of the current and voltage is carried out at regular intervals. With the approach, the current and voltage parameters are determined for each degree of the 360° of a sampled cycle. Employing conventional and thus practical analog-to-digital converting devices having, for example, 12-bit outputs, the technique of the metering approach still permits very high accuracies of readout. This high accuracy is achieved through a dual sampling technique wherein each 1° sample is first submitted to conversion to binary form for the purpose of developing a scaling evaluation and a scaling factor. The scaling evaluation is utilized to selectively adjust the gain of an amplification stage to which the electrical parameter for the sampled 1° is submitted prior to a second conversion. This second conversion then provides a data read-out which is multiplied at high speed by the scaling factor to provide an expanded digital data value corresponding with the electrical parameters of voltage and current. The expanded values may, for example, have as high as 21 significant bits in conjunction with a sign bit. These expanded data then are selectively multiplied to develop digital representations for 12 power parameters, such multiplication being carried out for each of 360° of a sampled cycle.

The metering apparatus responds to cross-over events of the sampled cycles to commence sampling on a degree-by-degree basis. Thus, the method is capable of metering both single-phase and poly-phase systems. Because of the responsiveness of the apparatus to crossover locations, such otherwise evasive electrical quantities such as volt amperes are readily developed through the approach of measuring a cycle of voltage and a corresponding cycle of current, the sampling of each such cycle being commenced with the detection of a cross-over. By submitting the initial of the parameters to memory and subsequently carrying out multiplication, not only are the noted volt ampere quantities available with the method of the invention, but through selective delay techniques, Q and var quantities readily are determined. Because front end analog components necessarily are employed to provide step-down functions as well as a part of the analog-to-digital conversion function, the apparatus of the invention incorporates a zero offset evaluation technique which is carried out periodically during the operation of the metering function, for example, following the measuring of a cycle of each of three phases of power.

In one embodiment of the invention, implementation of the conversion and multiplication procedures of the apparatus is provided through employment of a synchronous state machine operating in concert with a data signal processing device. With these components, the advantageous very high sampling rates are achieved.

The digital approach applied with the method and apparatus also permits a digital calibration technique to be employed wherein calibration quantities provided by the manufacturer are retained in non-volatile memory and are employed as multiplication factors in the course of processing sampled data.

Another feature of the invention is to provide an apparatus for metering an electrical power supply which includes a step-down arrangement connectable with the supply for deriving first and second electrical parameter sample signals of given waveform amplitudes during corresponding given cycles of the supply. An amplifier arrangement is provided having gain characteristics which are controllable in response to a gain control input for selectively amplifying the first and second sample signals to derive corresponding first and second scaled signals. A converter is actuable to convert the first and second sample signals to corresponding first and second range digital values and subsequently actuable to convert the first and second scaled signals to corresponding first and second data digital values and a control is provided for actuating the converter to derive the first and second range digital values and corresponding first and second scaling factors. The control further is responsive to the first and second range digital values for providing the gain control input at predetermined scaling levels and for subsequently actuating the converter to derive the first and second data digital values. This control further multiplies the first and second data digital values with respective first and second scaling factors to provide first and second expanded data digital values. The expanded data digital values are within a range extending to at least about 21 binary bits, the control means being responsive to a predetermined commencement location of the waveform of the first electrical parameter sample signal for commencing the actuation of the converter and subsequently affecting the actuation at predetermined, regular intervals. The control includes a parameter memory for selectively retaining the first expanded data digital values and is responsive to effect a multiplication of each parameter memory retained first expanded data digital value with a second expanded data digital value from the sequence thereof developed following a delay selected to derive predetermined power parameter metering output data.

Another feature of the invention is to provide apparatus for metering a polyphase power supply of waveform exhibiting voltage and current electrical parameters of given amplitudes within cycles defined by cycle envelopes, which includes a step-down arrangement connectable with the power supply for deriving first and second electrical parameter sample signals of amplitudes corresponding with said given amplitudes. A conversion arrangement is responsive to the first and second electrical parameter sample signals and is actuable to derive respective first and second digital data values corresponding with the given amplitudes and having an extent within a range extending to at least 21 binary bits. A sampling control is provided for actuating the conversion arrangement to effect the derivation of first and second digital data values at a predetermined, regular sampling rate commencing at a predetermined commencement location of the cycle envelope of the first electrical parameter sample signal and including memory for selectively retaining the first digital data values derived with each actuation. The sampling control is responsive to effect a multiplication of the memory retained first digital data values and the second digital data values following selective power parameter defining delays to provide power parameter digital values with respect to each conversion arrangement actuation. Finally, a processing arrangement is provided which is responsive to effect integration of a sequence of the power parameter digital values for deriving meter output signals.

Another feature of the invention is to provide a method for metering a power supply of waveform exhibiting current and voltage electrical parameters of given amplitudes within cycles defined cycle envelopes which comprises the sequence of steps of: monitoring the source to provide first and second electrical parameter signals of amplitudes corresponding with the given amplitude; converting the first and second electrical parameter signals to respective first and second binary range values at a predetermined regular sampling rate commencing upon the occurrence of predetermined commencement locations of select cycle envelopes; deriving first and second scaling factors for each respective first and second binary range values; amplifying the first and second electrical parameter signals at gains corresponding with respective first and second binary range values; converting the amplified first and second electrical parameter signals to respective first and second binary data values at the predetermined regular sampling rate; multiplying the first and second binary data values with respective first and second scaling factors to derive corresponding first and second expanded binary data values within a range extending to at least about 21 binary significant bits; and selectively multiplying the first and second expanded binary data values together to derive predetermined metering outputs.

Another feature of the invention is to provide a method of metering a power supply of waveform exhibiting current and voltage electrical parameter of given amplitude within cycles defined by cycle envelopes which comprises the steps of:

monitoring the supply to provide first and second electrical parameter sample signals of amplitudes corresponding with the given amplitude;

converting the first and second electrical parameter sample signals, commencing upon the occurrence of a predetermined commencement location of the cycle envelope of the first parameter sample signals, to respective first and second binary data values each exhibiting a range of significant bits extending to at least about 21, at a predetermined regular sample rate;

retaining the first binary data values in memory for a delay interval selected for deriving said power parameter digital values;

multiplying concurrently developed first and second binary data values to derive watt digital values;

multiplying the second binary data values with the memory retained first binary data values following a predetermined delay to derive a select power parameter digital value;

accumulating a sequence of watt digital values to derive watthour meter output signals; and accumulating a sequence of the select power parameter digital values to derive corresponding select meter output signals.

Other objects of the invention will, in part, be obvious and will, in part, appear hereinafter.

The invention, accordingly, comprises the apparatus and method possessing the construction, combination of elements, arrangement of parts and steps which are exemplified in the following disclosure.

For a fuller understanding of the nature and objects of the invention, reference should be had to the following detailed description taken in connection with the accompanying drawings.

BRIEF DESCRIPTION OF THE DRAWINGS

FIGS. 2A and 2B combine to represent a data flow block diagrammatic representation of the circuits employed for sampling and multiplying techniques according to the invention;

FIGS. 3A and 3B combine as labelled to provide a diagram of a circuit structure for deriving the sampling and control according to the invention and including digital multiplication and digital signal processing functions;

FIGS. 4A–4C are a program flow chart for the synchronous state machine components of the circuit of FIG. 3A;

FIGS. 5A–5G combine to provide a flow chart representing the program for the digital signal processor of the circuit employed with the apparatus of the invention;

FIG. 7 is a block diagrammatic representation of a version of the apparatus of the invention employing two high speed digital signal processors.

DETAILED DESCRIPTION

In its general aspects, the apparatus and method of the invention involve a highly enhanced sampling of the polyphase sinusoid input of a utility or the like. With the approach, sampling of a given sinusoid cycle may be carried out in successive 1° increments. Each of this relatively high number (360) of samples per cycle is converted or digitized to a digital value using a practical 12-bit analog-to-digital converter. Because such practical converters will provide a range from lowest sampled amplitudes to peak sampled amplitudes of $2^{12}$ or 4096 increments, without more, evaluation at lower sample amplitudes would be ineffective in terms of their significant bit accuracy. However, conversion is carried out in two steps, the first being a range conversion wherein the sample amplitude is evaluated with respect to 11 possible ranges of amplitude or scaling factors. That range data then are stored and the sample then is amplified in accordance with a desired range code to again be submitted to the analog-to-digital converter to provide a data conversion. The product of these latter data and the range data is then found to, in effect, achieve an output having a significant bit range extending to $2^{21}$ or 2,097,152 increments. Thus, a great improvement in accuracy of reading for each of the one degree samples is developed. This same multiplication function also is employed, where called for, to develop the 12 possible electrical parameters of the system with respect to each sample obtained. Because the system is digitized essentially from the point of front end digital conversion, calibrating corrections can be provided in digital form as opposed to the otherwise time consuming requirements of adjusting potentiometers and the like. Further, the digital technique permits an ongoing evaluation of any ambient affects upon the front end analog circuitry on a relatively rapid basis.

Figure 1:
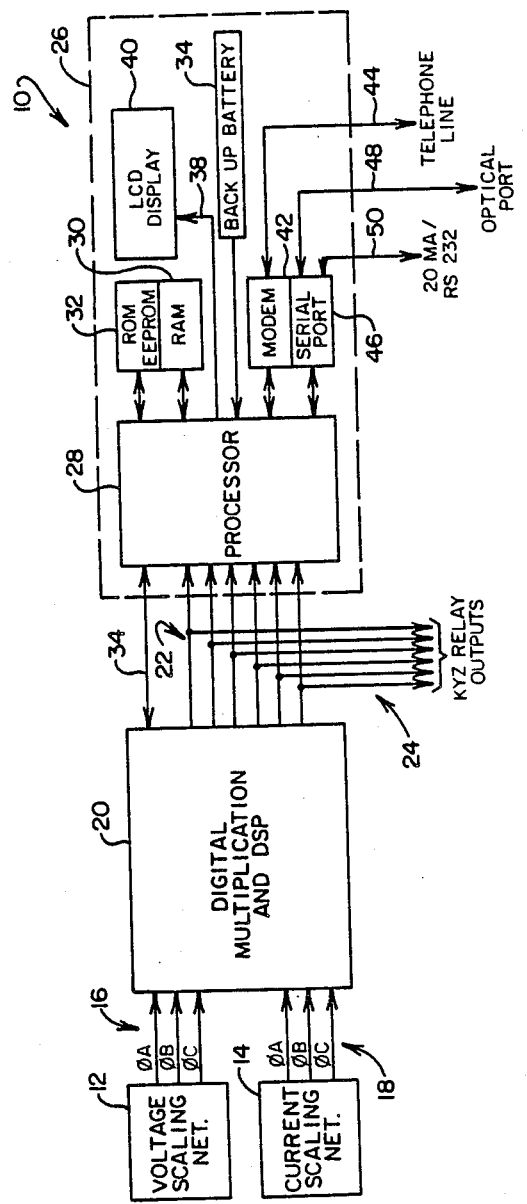
FIG. 1 is a block diagrammatic representation of the metering apparatus of the invention.

Looking to FIG. 1, a representation of the metering approach of the invention is represented generally at 10. Device 10 is coupled typically to a polyphase line input and employs conventional step-down networks as represented at blocks 12 and 14 to provide respectively voltage and current related inputs, for example, for three phases: A, B, and C. In the latter regard, the phase A-C voltage input signals are provided at three-line grouping 16 while voltage signals corresponding with a current developed by current transformers are provided at three-line grouping 18. Line groupings 16 and 18 are directed to the sampling input of a high speed digital control stage represented at block 20. This control stage 20 includes the dual conversion components for range and data with respect to each sample, as well as multiplication components. The stage further includes a processing network for treating the parameters derived for each sample and developing pulse outputs which can be employed for readouts and the like as are conventionally used in industry. To achieve the speeds required for this latter processing, a general purpose digital signal processor (DSP) is employed.

Outputs for six selected electrical parameters which always will include watthours are provided by the latter processing function as represented by the six-line grouping 22. The pulse carrying outputs at line grouping 22 are employed in typical fashion to provide KYZ relay outputs as represented at tapping line grouping 24 and also to provide the inputs to a microprocessor driven electronic register represented within dashed boundary 26. Register 26 is controlled from a conventional microprocessor represented at block 28, the input ports of which are coupled to receive line grouping 22. In conventional fashion, the microprocessor 28 operates in conjunction with random access memory (RAM) as represented at block 30 as well as in conjunction with a program contained in read only memory (ROM) as well as electronically erasable read only memory (EEPROM) as shown at block 32. The electronically erasable read only memory as represented at block 32 functions to carry calibrating information which is submitted to the digital signal processor (DSP) function at block 20 at such time as the device 10 is powered up. This dual directional serial communication is represented by line 34. To maintain the data developed as outputs at array 22, a back-up battery is employed with the register 26 as represented at block 36 and line 38. The microprocessor 28 functions to treat the data received from line grouping 22 and provide a visual display, preferably through a liquid crystal (LCD) display represented at block 40. To permit the device 10 to be programmed remotely, a modem as represented at block 42 is provided which functions to permit carrying out of programming and communication via a telephone link as represented at line 44. Similarly, it is desirable to provide for on-site programming, for example, through an IR communications or optical link. This is provided through a serial port represented at block 46 and line 48. Also conventional, serial data communication may be provided, through the port 46 as represented at line 50.

To achieve the processing speeds requisite to carrying out a sampling each degree of a conventional power cycle, for one embodiment of the invention, a synchronous state machine approach is employed. With such an approach, decisional software overhead and the like commonly encountered with microcomputers is avoided and a full development of requisite electrical parameters commencing with watthours is achieved for each sample degree or about each 46 microseconds. For example, operating at a 5.4 MHz clock speed, the sychronous state machine carries out 128 steps to process a 1° sample.

As a prelude to considering the architecture of the circuitry for the sampling and multiplying technique, reference is made to FIGS. 2A–2B where the operation of the system is illustrated in data flow block diagrammatic fashion. The figures should be considered in an orientation corresponding with their associative labeling.

FIG. 2A shows that data flow as established for three phases, A–C, and it may be observed that the components of the figure are identical and thus identically labeled. Accordingly, the same numeration is employed to describe corresponding components from phase to phase along with prime notations for phase B and double prime notations for phase C.

Data flow is shown to commence with the insertion of voltage analog signals represented at arrow 60 to an analog-to-digital conversion function represented at block 62. These voltage analog signals will be provided for phases A-C as well as a zeroing or ground value employed for periodic adjustment of values of the system. In similar fashion, the corresponding current analog signals are provided as phase designated voltages as represented at arrow 64 shown being directed to an analog-to-digital function represented at block 66. Preferably, the inputs 60 and 64 are multiplexed in the sequence phase A-phase C in the noted 1° sampling intervals for a full cycle of 360°. In the order of sampling, first phase A is sampled, then phase B and then phase C following which a zeroing measurement is taken. Thus, any of the given phase cycles are measured approximately every third cycle. In the latter regard, 540° are used for each cycle in order to carry out multiplication to develop such parameters as var, Q, and volt amps. With the arrangement, the system is capable of operating in conjunction with single or polyphase inputs, and, in this regard, will be seen to react in conjunction with cross-over events to detect the commencement of the initial phase under sampling.

The output the A/D function 62 is shown being directed in data flow fashion to a voltage scaler function as represented at block 72. In effect, two analog-to-digital conversions are taken with the system, one to provide the scaler data represented at block 72 in which the 12 bits of digital information representing the amplitude of the 1° sample and a sign bit are employed to establish 11 scaling levels of amplitude from 0 peak amplitude. The initial digital conversion is for this scaling function and, as represented by flow lines 74, 76 and block 78, this initial value of the amplitude of the sample is used to access a look-up table in random access memory (RAM) to determine an 11-bit scaling value or factor which is used as a multiplier. This 11-bit scaler then is provided as represented at lines 80 and 82 as an input to a multiplication step represented at circle 84.

The voltage scaler value 72 additionally is used to provide an input to an amplification or treatment stage which amplifies the voltage sample input 60 prior to a next conversion by analog-to-digital function 62. Thus the conversion now represented along flow lines 68 and 70 and block 86 is one of voltage data of 11 data bits plus a sign bit. As represented at flow line 88, these 11 bits then are directed to the multiplication function 84, whereupon a scale adjusted valuation or expanded data digital value is developed of enhanced significant bits which may have an extent of 21 data bits plus a sign bit for a highest scale level and this enhanced and highly accurate representation of the amplitude of voltage for the sample degree then is available as represented at flow line 90.

The current samples as described at line 64 are converted in similar fashion as represented at block 66 such that, initially, a scaler current valuation is made, as represented at flow lines 92 and 94 leading to the scaler function represented at block 96. This current scaler function, as before, provides an input as represented at lines 74 and 76 to a look-up table of 11 values in random access memory as represented at block 78. The resultant scaler or scaling factor, as before, is then provided to a multiplication function via flow lines 80 and 82. However, this same scaling value also is utilized to adjust the gain of an input amplification stage to the conversion function 66 such that a next data conversion then provides a digital current data signal as represented at block 98 having 11 data bits plus a sign bit. As before, as represented at line 100, this current data digital value then is submitted for multiplication as represented at circle 102 with the RAM contained scaling factor as represented being asserted from flow line 82. The resultant product, as represented at flow line 104 will be a highly accurate representation of the amplitude of the current sample having as many as 21 significant digital bits of information plus a sign bit.

The sampling and digital multiplication function now has highly enhanced valuations of voltage and current for the given 1° sample. Returning to flow line 90, the voltage sample is adjusted or corrected for gain and phase errors. These errors will occur at the front end of the system where analog components such as transformers, scaling resistors, and conversion functions are carried out. Additionally, phase or time error can occur in consequence of the transforming as well as conversion. To correct for these normally encountered vagaries, each meter is tested in the course of its assembly, for example, in conjunction with a standard. Correction of the output of the meter under test with the standard then is carried out by providing a correction factor for each sample degree of any given cycle and such data are positioned in random access memory (RAM) at power-up. The look-up of the correction factor is represented at block 106 and the 21-bit data output thereof is represented at flow line 108 extending to a multiplication function represented at circle 110. A resultant corrected voltage sample digital representation which may have as many as 21 data bits plus a sign bit then is directed as represented by flow lines 112 and 114 to temporary storage in random access memory as represented at block 116. The voltage value for the given sample at line 112 is employed to develop a volthour parameter and thus, the flow line for the value is seen to progress, as represented by lines 118 and 120 for further treatment. However, as represented at line 122 and a multiplication function represented by circle 124, a volts$^2$ multiplication may be carried out to provide a volts$^2$ valuation for processing as represented at flow line 126.

A watt valuation for the 1° sample is provided by a multiplication represented at circle 128 which provides the product of volts at line 112 with the corresponding current valuation from line 104 as represented at line 130. This product then is submitted for further processing as represented by flow line 132.

The parameter, Q, represents a lag in phase of 60° with respect to watts. Accordingly, a multiplication function is provided as represented at circle 134 which carries out multiplication of the current digital value as represented at flow lines 104 and 136 with voltage only after a delay of 60°. Thus, the volt data are withdrawn from RAM memory function 116 as zero valuation represented at line 138 until after a 60° delay occurs to develop an output for the Q parameter as represented at flow line 140.

Similarly, the var parameter is one representing a 90° delay. Thus, as represented by the multiplication function at circle 142, the current values for the given sample at lines 104 and 144 are multiplied by zero voltage digital values until after a 90° delay. Accordingly, the voltage digital valuations are active participants in the multiplication activity represented at circle 142 only after a 90° delay and the products of the multiplication extend in the diagram along line 143.

A determination of the parameter volt amperes (VA) in essence, requires an alignment of the voltage and current cycle envelopes. Inasmuch as the current component may be spaced from the voltage component by as much as 180°, zero crossings or suitable predetermined commencement location are monitored for this function and, as the zero crossing of the current component is detected, then the voltage values stored earlier in RAM 116 are engaged in a multiplication function. The latter function is represented at circle 148 shown accessing the current valuation from line 104 and RAM contained voltage digital information from line 150. A resultant VA evaluation for the given sample then is submitted for further processing as represented at flow line 152.

From the above, it may be apparent that, with a maximum possible delay of 180° to develop the VA output, the total number of sample degrees for each cycle evaluated will be 540°. The resultant outputs of all three phases A–C then are seen to be combined at earlier-described lines 120, 126, 132, 140, 143, and 152.

Looking to FIG. 2B, the above designated output flow lines are seen directed to a data processing function which, as discussed above, is controlled by a digital signal processor (DSP). However, one further value is added to the products which are made from the conversion functions 62 and 66. At the conclusion of sampling a full cycle of phases A, B, and C, a zero valuation is asserted to the conversion function such that any offset values may be detected for summing correction in the processing procedure. Looking to the process, it may be observed that the volt digital values for each degree sample for each of phases A–C flow as data represented by lines 120 and 154 through a zero correction function represented at block 156. The resultant corrected valuation, which may be as high as 21 significant data bits is then submitted as represented at line 158 to an accumulating register represented at block 160. This register accumulates the values and provides, in effect, an integrating function which, upon reaching a predetermined value, develops a signal as represented at line 162 which is directed to an overflow register represented at block 164. Register 164 provides a pulsed output representative of volthours as depicted by flow line 166. Generally, the number of pulses corresponding with a given parameter valuation is determined by the end user. The data as represented at line 166 flows to a parameter selection function represented at block 168 for outputting as one of six channels of data represented at line grouping 170. These six channels correspond with line grouping 22 as described in conjunction with FIG. 1.

In similar fashion, the volt$^2$ parameter data are shown flowing via line 126 and, as represented by line 172 and block 174, are corrected for zero offset, whereupon the data bits which may be as high as 21 are directed to an accumulating register as represented by line 176 and block 178. As before, the values accumulate for each phase and, at some predetermined overflow value, are submitted to an overflow register as represented by line 180 and block 182. A resultant pulse output is developed from the register function 182 as indicated by line 184 representing an integrated valuation for volt$^2$ hour which then flows to the selection procedure at block 168 for possible election as an output at line six line grouping 170.

Data flow representing the electrical parameter, watt, is shown flowing via line 132 and, as represented at line 186 and block 188, such data are adjusted for zero offset and submitted as represented by data flow line 190 and a selection function represented by switch S1 to either of two accumulating register functions represented at blocks 192 and 194 via respective lines 196 and 198. The register function represented at block 192 collects data corresponding with a positive or "watts out" cycle for integration, while a corresponding "watts in" compilation is evolved in conjunction with the accumulating register function 194. With the instant digital approach, a determination as to the appropriate polarity for a given sampled phase cycle is provided on a historical basis wherein the polarity then available at a polarity detector function represented at block 200 controls the orientation of the selection represented by switch S1. This control is represented by dashed line 202. The polarity detector function at block 200 may be implemented as an up/down counter performing in conjunction with the earlier-discussed sign bit of the converted data. This sign bit input to the register is represented by flow line 204 extending from flow line 190. Because of the vagaries of the system and slight phase deviations which will be encountered during sampling, the polarity detector will be incremented upwardly with positive sign bit inputs and, conversely, incremented downwardly with the input of negative bits. However, the overall history of signage for any given number of samplings, for example 360, will determine control over the switching function S1, i.e. that indication as to whether the information is with respect to watthours out or watthours in. As before, the accumulated valuations in register function 192 will be provided as outputs as represented at line 206 for a given threshold, which information is directed to an overflow register function represented at block 208. A pulse designated output occurs from register 208 as represented by flow line 210 which is directed to the selection function at block 168 for outputting as a channel at line grouping 170. Similarly, the watthour in data developed in accumulating register 194 is outputted, as represented by flow line 212 to an overflow register function represented at block 214 for presentation as pulse data, as represented at line 216 to the selection function at block 168.

Q valuations, as represented by the data flow path at line 140, are shown being corrected for zero offset, as represented by flow line 218 and block 220, whereupon the data bits for this parameter are submitted to a selection function represented by a switch S2 and lines 224 and 226 to respective accumulating register functions represented at blocks 228 and 230. Block 228 functions to provide an integrated valuation for Qhours out, while line 230 provides the corresponding valuation for Qhours in. As before, the general flow of power, as developed by the historic accumulation of the polarity detector 200 determines the selection represented by switching function S2. Where Qhours out are at hand, then the overflow of the accumulating register function 228, as represented at line 232 is directed to an overflow register function represented at block 234. The resultant, pulse categorized data representing Qhours out are developed and submitted as represented by line 236 to the selection function represented at block 168 and, if selected, are provided at six line grouping 170. Correspondingly, the Qhour in integrated valuation evolved at the register 230 provides an overflow output at a predetermined level as represented at flow line 238 which is directed to an overflow register function represented at block 240. The resultant pulse designated Qhour in data then are submitted as represented flow line 242 to the selection function represented at block 168 and thence, if selected, to an output at six line grouping 170.

The flow of var data, as represented at line 143 from the three phases is shown directed via line 244 to the earlier-described zero offset correction function represented at block 246. Upon correction, this data flow then is submitted to a dual selection logic to evolve four quadrant varhour metering. In this regard, as represented by data flow line 248 and sign bit flow line 250, the signage for each data sample is submitted to a polarity detector function represented at block 252 which, as before, may be implemented as an up/down counter. The polar sense of this counter, i.e. + for lag and − for lead will be determined on an historic basis as before, being an accumulation of, for example, 360 sign bit components. Thus, the valuation representing that history controls a selection function represented by switch S3, such control being represented by dashed line 254. With the lag and lead characteristic thus selected by the function represented at S3, the data are then distributed in accordance with overall power flow as represented by line 256 extending to a selection function represented by switch S4 leading, in turn, to lines 258 and 260. Selection function S4 is controlled, as above, from the polarity detector 200, as represented at dashed line 202. Line 258 extends to an accumulating register 262 which collects data valuations for varhour lag out and the overflow representing integrated increments thereof is represented, as presented at line 264, to an overflow register function represented at block 266. Pulse categorized outputs of function 266 are represented by data flow line 268 extending to the selection function represented at block 168 and, if elected, to six line grouping 170. An oppositely-disposed power flow selected by the function represented at switch S4 shows a data flow via line 260 through an accumulating data register function represented at block 270. Thus, for this direction of power flow, the overflow representing an integrated valuation of the register function 270 is provided at line 272 extending in data flow fashion to an overflow register function represented by block 274 and shown having a pulse categorized data output represented at line 276 corresponding with varhour lead in data.

Where the polarity detection history represented at block 252 shows a positive valuation or lag condition, then the selection function represented by switch S3 will elect a data flow represented by path line 278 leading to the selection function represented by a switch S5. For power flow out conditions, then as represented by line 280 showing data flow to an accumulating register function represented at block 282, an integration occurs providing an overflow data flow at line 284 directed to an overflow register represented at block 286, which, in turn, provides a pulse categorized output data flow represented at line 288 corresponding with varhour lead out. The latter data are submitted to the selection function at block 168 and, if selected, will appear at the six line output grouping 170.

Where the selection represented at switch S5 is a power flow to the utility, then the data flow is represented by line 290 as extending to an accumulating register represented at block 292 wherein the values of the sampled inputs are collected. The resultant integration provides an overflow as represented by the data flow line 294 extending to an overflow register represented at block 296. A pulse categorized output then is provided, as represented by data flow line 298 corresponding with varhour lag in data which is directed to the selection function represented at block 168 for presentation, if selected, to the six-line grouping 170.

VA data flow is represented at line 152 as flowing as represented by line 290 to a zero offset correction function represented at block 292. The corrected data then flows to an accumulating register function through a selection feature represented by switch S6 controlled from the polarity detector 200 via line 202. For a positive history represented at the detector function at block 200, then the data flow is represented as along line 296 leading, in turn, to the accumulating register represented at block 298. An integration form of treatment ensues providing an overflow represented at flow path line 300 directed to an overflow register function represented at block 302. A resultant pulse categorized signal output representing VA hour out data then is directed to the selection function represented at block 168 for presentation, if selected, to a channel of the six-line output grouping 160.

In the event the power flow is toward the utility, then the data flow from the selection function represented at switch S6 is along line 306 directed to an accumulating register function represented at block 308 for a value accumulation amounting to an integration. The overflow is then directed as represented by line 310 to an overflow register function represented at block 312 to provide a pulse categorized output data flow represented at line 314 corresponding with the data VA hour in. Flow line 314 is directed to the selection function represented at block 168 and if the subject data are selected, then it will be outputted at one channel of six-line grouping 170.

Figure 3A:
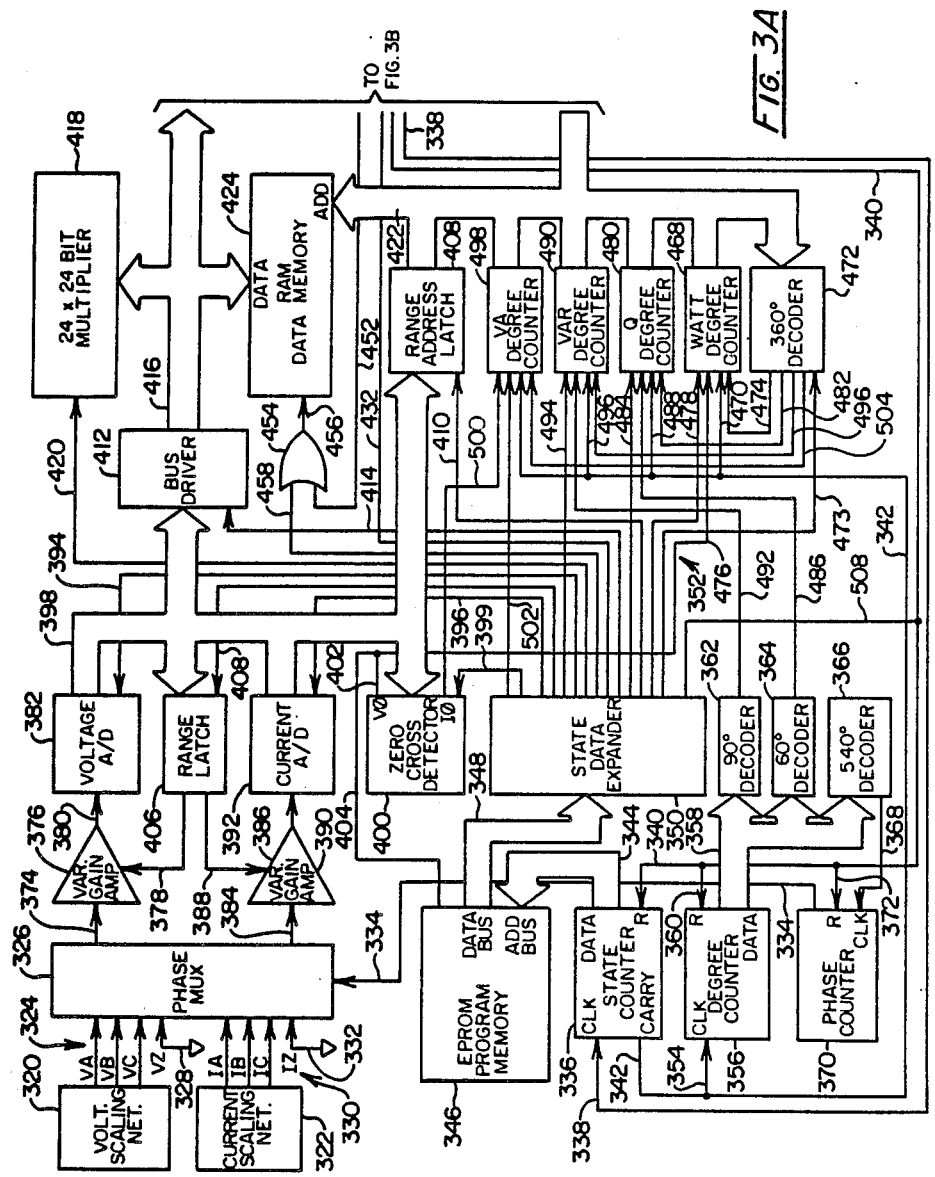
Figure 5B:
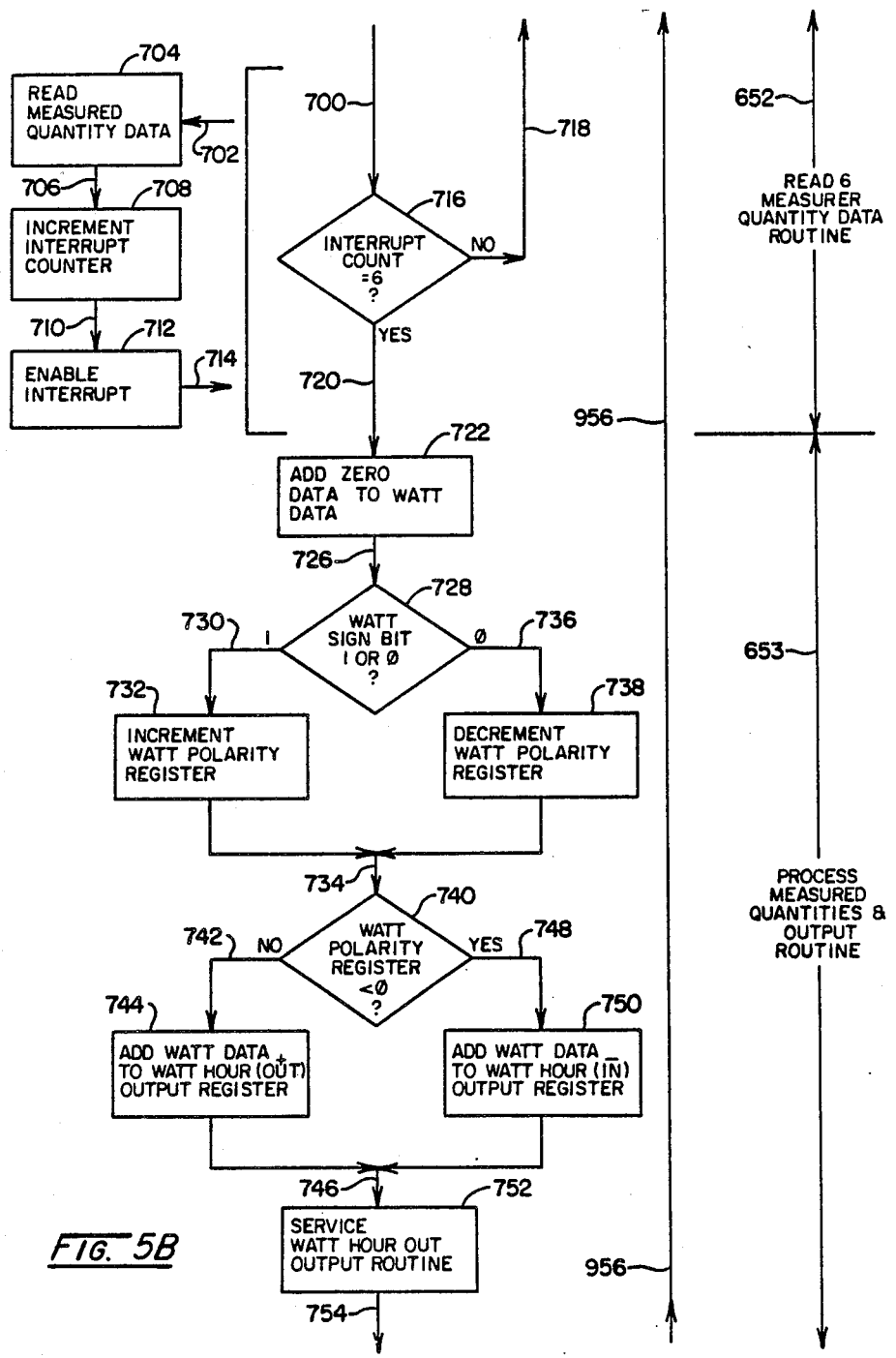
Figure 5E:
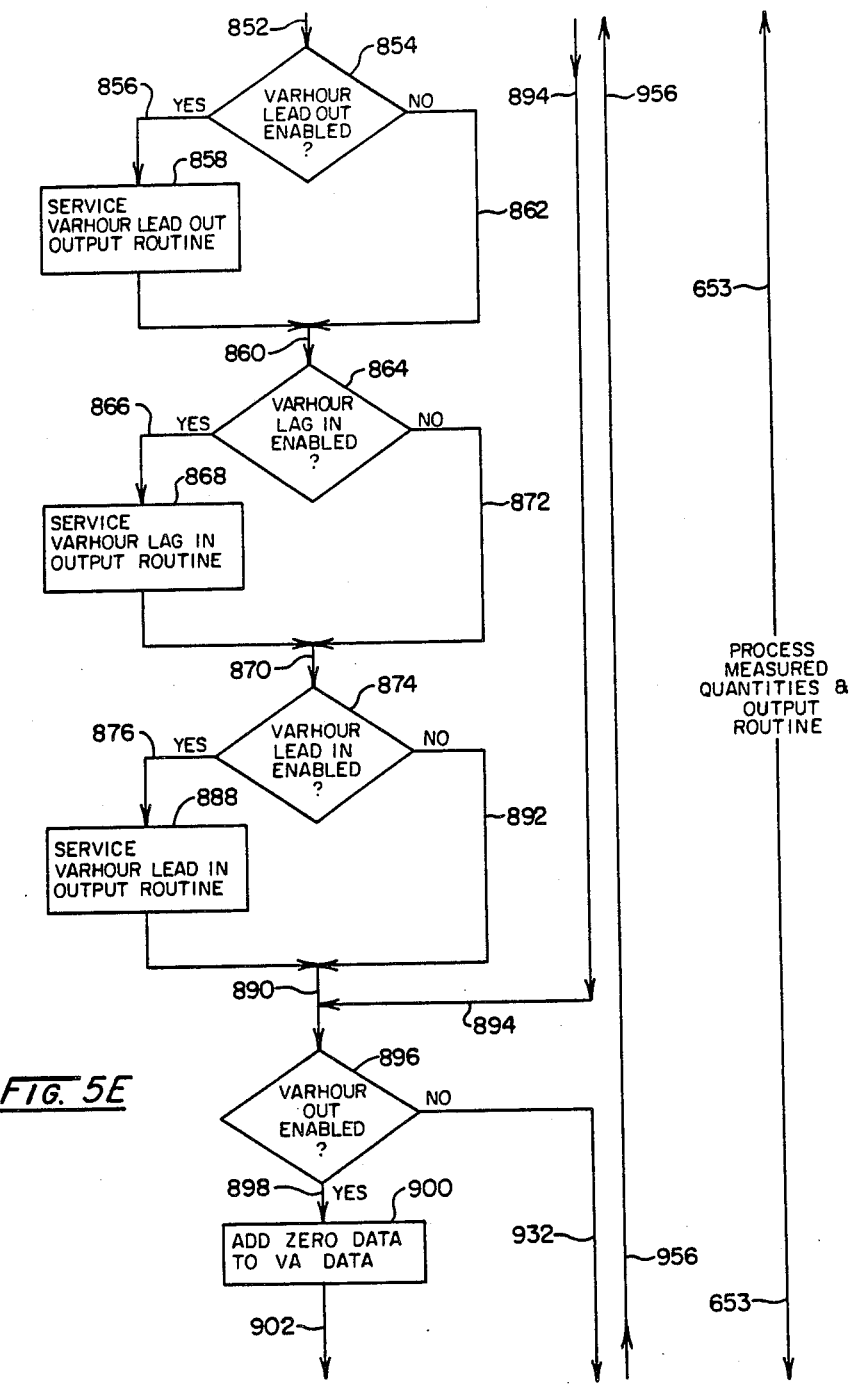
Figure 5G:
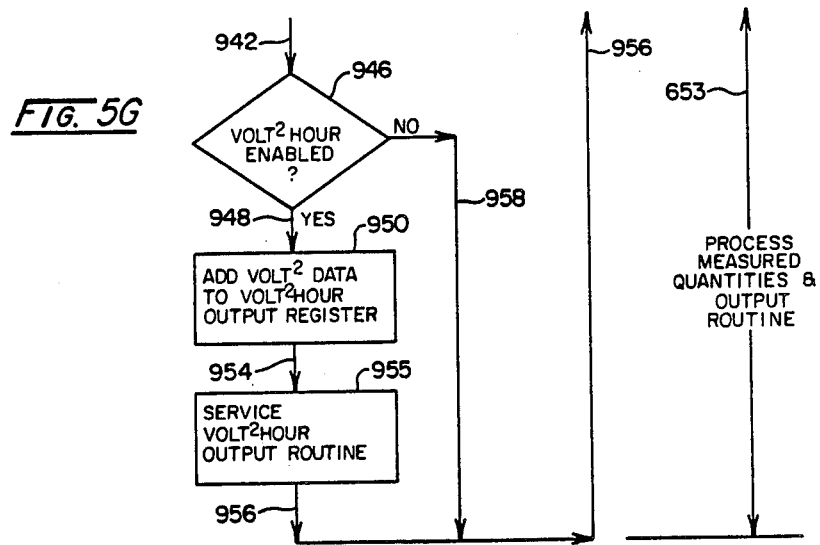

Referring to FIGS. 3A–3B, the circuit structuring for deriving the sampling, control including digital multiplication and digital signal processing (DSP) functions described in conjunction with block 20 in FIG. 1 is revealed. In FIG. 3A, the analog networks for treating incoming three-phase power are represented at blocks 320 and 322. These step down functions will include conventional voltage and current transformers along with resistor and capacitive components suited for appropriate scaling and conversion of current to voltage. The resultant voltage analog signals are presented via three-line grouping 324 as labeled VA, VB, and VC to corresponding inputs of a phase multiplexer represented at block 326. Additionally provided as an input to the multiplexer 326 is a line labeled VZ representing a zero input for the earlier-described zero offset measurements.

In similar fashion, the analog current signals for phases A, B and C are provided at three-line grouping 330 as labeled IA, IB and IC. Additionally, a line 332 labeled IZ and coupled to ground provides the noted zero offset input to the multiplexer for zero offset correction in conjunction with current.

For the embodiment shown, the requisite speeds or operational rates for the components shown in FIG. 3A are derived employing a synchronous state machine form of control. This control provides a sampling rate such that the phase A (VA) input is sampled for example 360 times followed by the remaining voltage phases and a zero offset measurement at line 328. Selection of phase at multiplexer 326 is represented at line 334. Additionally, the current phases are sampled commencing with phase A (IA) and these current inputs are sampled for example 360 times per cycle. Commencement of the sampling procedure will be seen to be regulated in conjunction with the detection of zero cross-overs of the pertinent sinusoids.

Looking momentarily to the counting components of this synchronous state machine, it may be observed that a state counter is provided at 336, the clock input to which is provided, for example, at 5.4 MHz at line 338. Reset from line 340 and having a carry output at line 342, the counter 336 provides a 7-bit output at 7-bit bus 344 which functions to sequentially address an EPROM program memory 346 so as to provide corresponding sequence of 128 instructions at the 16-bit output data bus 348. Three sets of these 128 instructions will be seen to be employed, one set as a zero cross routine; one set as a multiply routine and one set as a zero routine. Bus 348 extends, in turn, to a state data expander 350 which functions to provide the requisite number of control output lines, for example about 30 required for exerting control from the synchronous state network. These control outputs are represented at a line grouping represented generally at 352.

The carry output, representing 128 events, having been completed, for example, for treating a 1° sample, is directed via line 354 to the clock input of a degree counter 356. Thus, with each clock input, the counter 356 will provide a progressive count presented at 9-bit output bus 358. Counter 356 is reset from lines 340 and 360. Bus 358 transmits the degree count information to a 90 count or 90° decoder 362, a 60° or 60 count decoder 364, and a 540° or 540 count decoder 366. The carry out terminal of 540° counter 366, in turn, is directed via line 368 to the clock input of a phase counter 370. Reset from lines 340 and 372, the phase counter 370 provides outputs corresponding with the completion of a full cycle sampling for each of phases A, B and C via earlier-described line input 334 to the multiplexer 326. Thus, the multiplexer 326 proceeds through the sequence of phases A, B and C for both voltage and current in addition to the earlier-noted zero offset measurement.

The phase designated voltage output of phase multiplexer 326 is provided at line 374 for introduction to the input of a variable gain amplifier stage 376. Having a gain control represented at line 378 and an output at line 380, stage 376 provides the ranging input and subsequent scaled data input at line 380 to the input of a voltage analog-to-digital converter (A/D) 382.

In similar fashion, the sequence of phases A–C for current samples are provided at line 384 by the phase multiplexer 326 for presentation to the input of a variable gain amplification stage 386. Gain control to stage 386 is represented at line 388 and the output thereof at line 390 is directed to the input of a current analog-to-digital converter (A/D) 392. Converters 382 and 392, respectively, are controlled from line grouping 352 of the state data expander as represented at lines 394 and 396 so as to perform two conversions for each degree of amplitude data. This conversion occurs at a rate adequate to achieve the noted 360 samples per phase cycle. Accordingly, the converters 382 and 392, which provide 12-bit outputs to a corresponding 12-bit bus 398 should carry out a conversion within about 5 microseconds. The converters may be provided, for example, as type AD7572 ADC converters marketed by Analog Devices of Norwood, Massachusetts. Activation of the converters for the commencement of any given operation commences with the carrying out of a zero crossing routine controlled from program memory 346. This 128 step routine is outputted at 16-bit bus 348, expanded at expander 350 and presented from line grouping 352 as controls to converters 382 and 392 via respective lines 394 and 396. Thus sampling occurs during this routine specifically with respect to the voltage inputs for phase A, conversions thereof at zero gain input from lines 378 being presented to 12-bit bus 398. Bus 398, in turn, extends to a zero cross-over detector network 400 which responds to the noted sign bits output of converter 382 to detect a change of polarity and thus a zero cross-over for any given sinusoid. Detector 400 is enabled for this search from line 399 extending from State Data Expander 350. When this cross-over or other suitable commencement location for voltage is detected, an output is provided at lines 402 and 404 which is directed, inter alia, to the program memory 346 to cause it to enter into a multiply routine which is another 128 steps in extent. At the commencement of this multiply routine, a range latch 406 is controlled via line grouping 352 of the synchronous state machine as represented at line 408 to provide a zero gain output control via lines 378 and 388 to respective gain stages 376 and 386. Stage 376 then provides a sample input for the first degree of sampling at line 380 which is converted by converter 382 to a 12-bit range digital value at bus 398 representing 11 bits of range data plus a sign bit. This information is provided simultaneously to the range latch 406 via bus 398 as well as to a range address latch 408. Latch 408 is controlled by the synchronous state machine from line grouping 352 as at line 410.

Responding to the range data presented from bus 398, range latch 406 then adjusts the voltage gain at amplification stage 376 in accordance therewith. Thus, where the ranging value is higher, the gain is correspondingly set lower. Generally, eleven values of gain are provided representing eleven amplitude scaling regions. Voltage converter 382 then provides a data conversion which is presented at bus 398 and to a bus driver which directs the 11 bits of data digital values and sign bit to a bus driver 412. Controlled under the multiply routine from program memory 346 via line grouping 352 and specifically line 414, the bus driver responds at an appropriate time to present the 12 bits of data digital value data to 12 of the 24 bits of bus 416. 24-bit bus 416 extends to a 24×24 bit multiplier 418. Controlled by the synchronous state machine from output line grouping 352 and specifically as represented at line 420, the multiplier 418 preferaby is a high speed, low power 24×24-bit parallel multiplier fabricated in 1.5 micron CMOS and marketed as a type ADSP-1024A by Analog Devices, Norwood, Massachusetts. The ranging data as presented to range address latch 408 are employed via 8-bit bus 422 to address a random access memory (RAM) 424 to find one of 11 scaling factors corresponding with the range data procured from converter 382. Upon being accessed from memory, this scale multiplier then is submitted via 24-bit bus 416 to the multiplier 418 for multiplication with the second conversion data digital values. The resultant accurate evaluation of voltage expanded data for the 1° sample at hand is returned via bus 416 to memory 424 for temporary storage.

Very shortly (1 microsecond) following the sampling of data for 1° of voltage at line 374, current is sampled from line 384, being directed through variable gain amplifier 386 at a zero level of gain to be presented via line 390 to converter 392 to provide a range conversion. As before, this range digital value, present as 12 bits including one sign bit is submitted both to the range latch 406 and to the range address latch 408. At range latch 406, the data are employed to select an appropriate gain value of 11 levels for adjusting the gain at variable gain amplifier 386. With lower amplitudes, higher gain values are asserted. A next conversion by this amplified value at line 390 then is undertaken by converter 392 and presented at bus 398 as 12 bits of data digital values including a sign bit and is directed to bus driver 412, whereupon it is presented to multiplier 418 via 24-bit bus 416. Correspondingly, the range information supplied to the range address latch 408 is submitted via 8-bit bus 422 to a look-up table in RAM memory 424 to provide an appropriate multiplier or scaling factor corresponding with the scale level determination for submittal to multiplier 418. The resultant product for the 1° current sample will have as many as 21 significant bits plus a sign bit.

Thus with very accurate digital representations for a sampled 1° of voltage and the corresponding sampled 1° of current of the phase A cycle detected, the synchronous state machine then proceeds to carry out necessary multiplications. As a first aspect of this procedure, the accurate voltage data now retained in RAM 424 are submitted via bus 416, bus driver 426 (FIG. 3B) and 24-bit bus component 428 to the data input of a digital signal processor (DSP) 430. During this interval of time, the 24-bit bus at 416 is under the control of the synchronous-state machine and thus, the DSP 430 is caused to respond to the asserted data via a data ready signal from the synchronous state machine developed from line grouping 352 and specifically shown presented via line 432. Processor 430 may, for example, be provided as a type TMS 32010 Digital Signal Processor which is a 16/32-bit single-chip microcomputer combining the flexibility of a high speed controller with the numerical capability of an array processor. The device offers an alternative to multi-chip bit/processors and is marketed by Texas Instruments, Inc., Houston, Texas. Device 430 functions with the synchronous state machine to provide the earlier-described 5.4 MHz clock output at line 338 and performs in conjunction with a program retained in a programmable read only memory (EPROM) 434. Device 434 carries the program control for DSP 430 and is shown coupled with 24-bit bus 428 as well as with a 16-bit address bus 436 in common with DSP 430. To provide further control, the 16-bit bus 436 is shown extending at 438 to a control expander 440 to provide a control input via line 442 to memory 434. Line 444 is the DSP 430 control to expander 440. Control additionally is asserted via line 446 to a bus driver 448 representing an interface with 8-bit bus 422. Line 450 is shown extending to control the bus driver 426, while adjacent line 452 represents a control input to RAM memory 424 thorough OR gate 454 and line 456 to provide control thereover during those minor portions of the cycle wherein the DSP 430 has control over the major bus structure. During such control, for example at power up, DSP 430 functions to convey the earlier described data used for retaining magnitude/phase correction values developed during calibration to RAM 424 from processor 28 (FIG. 1). The opposite input to gate 454 emanates from line 458 representing a control from the line grouping 352 of the synchronous state machine. Finally, a control represented by line 460 extends from the control expander 440 to an output latching function represented at 462. This latching function 462 is coupled with 24-bit bus 428 and functions to develop the six channels of selected output described in conjunction with FIG. 1 at 22 and represented herein by the same numeration. Serial communication between the electronic register 26 shown in FIG. 1 at line 34 is represented with the same general numeration in FIG. 3B at lines 464-466. Lines 464-466 carry, respectively, reset data, received serial data and transmitted serial data.

Returning to FIG. 3A, following the submission of voltage values as multiplied by the gain and phase correction value, the corrected voltage value is retained in RAM 424 and a DATA READY signal is submitted via line 432 to DSP 430 for submittal of that information thereto. The synchronous state machine then recalls the corrected voltage data from RAM 424 and again submits it twice to the multiplier 418 for developing a voltage$^2$ value. Again, the DATA READY signal is provided as represented at line 432 to DSP 430 for submitting the voltage$^2$ data thereto.

The voltage data again are read from RAM 424 and are multiplied by the then-available current data to provide a watt valuation for the sampled degree. Accordingly, a DATA READY signal again is provided at line 432 to DSP 430 such that it might receive this information. The address to RAM 424 for submitting the corrected voltage data to multiplication in developing this watt value is developed from a watt degree counter 468 having an output coupled with bus 422 leading, in turn, to RAM 424. Watt degree counter 468 develops a succession of 360 addresses to RAM 424 in correspondence with a clock input thereto for each degree developed at line 342 and extending to the counter via line 470. Simultaneously with the commencement of the first address from the counter 468 to RAM 424, a 360 degree decoder function represented at block 472 is activated from line 473 of grouping 352 for a watt monitoring function under control from bus 422. At the termination of 360 degrees of watt evaluation, the watt degree counter 468 will be reset from decoder function 472 as represented at line 474. Clock enablement to the watt degree counter 468 is provided from line grouping 352 and specifically represented at line 476, while output enablement of the address devised by the counter 468 is provided from the same line grouping as represented at line 478. Line 476 extends from line 402 and the voltage zero crossing from zero cross detector 400. Thus, the watt degree counter is initially activated from this zero crossing or other suitable commencement location.

The determination of Q valuations for each sample is determined with respect to a delay representing a phase difference of 60°. Accordingly, Q determinations are not made until 60 samples have been developed. To provide this feature, a Q degree counter 480 is provided which, for 60 samples, provides an address output at bus 422 serving to assert a zero voltage valuation from RAM 424 to the multiplication function 418. Thus, for those first 60 samples, the Q valuation will be zero. However, upon the 60th sample, the Q counter then functions to submit the corrected voltage valuations from the single degree sampling in sequence by addressing RAM 424. These values then are multiplied at multiplier 418 by the then instantaneous valuation for current to provide a Q valuation. At the commencement of counting following the 60° lag, 360° decoder 472 commences to count through 360° and to provide a reset to the Q degree counter 480 as represented at line 482 to determine the end of a Q evaluation. Counter 480 is enabled from the line grouping 352 as specifically represented at line 484 by assertion of a clock enable signal thereto and its output is enabled as above discussed from the earlier-described 60° decoder 364 via line 486. One degree clocking to the counter 480 is provided from earlier-described line 342 through line 488.

Var valuations are characterized by a 90° phase variation. Thus, a var degree counter 490 is provided which functions to address the RAM 424 via bus 422 to output a zero voltage value for the first 90 samples or 90°. A determination of the 90th degree is provided by the earlier-described 90 degree decoder 362 and the information corresponding thereto is provided at line 492 for assertion at the clock enable input of counter 490. The output enable for counter 490 is provided from line grouping 352 as represented at line 494 while the clock input thereto derives from earlier-described line 342 and line 496. As before, counter 490 further is monitored by the 360° decoder function 472 such that upon the 91st sample or degree, 360 samples are decoded following which the counter 490 is reset by an input from decoder 472 as represented at line 496.

As noted earlier, the development of a volt ampere (VA) quantity requires, in effect, a coincidence of the envelopes of the voltage and current sinusoids for a given cycle. Accordingly, a VA degree counter is provided at 498 which is activated at its clock enable input by a zero crossing of the current signal as detected by detector 400 or suitable commencement location corresponding with that of the voltage signal, and asserted to the counter from line 500. Counter 498 is clocked from earlier-described line 342 and its output is enabled from the synchronous state machine line grouping 352 as specifically represented at line 502. The counter 498 is monitored by the 360 degree decoder function 472 such that it is reset following 360 degrees of counting and addressing memory 424 via line 504. All of the above determinations are made throughout a span of 540 degrees or 540 clock counts. Accordingly, at the termination of devising volts, volt$^2$, watt, Q, var and VA values, the 540 degree decoder 366 provides a clock input to phase counter 370 via line 368. Counter 370 then provides an output via lines 334 to phase multiplexer 326 to commence with the evaluation of phase B of the input. Control with respect to recommencing a search for a zero crossing of the voltage B phase is provided to function 400 as represented at line 506 and earlier-noted enablement line 399.

Following an initial zero cross routine, the synchronous state machine essentially repeats the above detailed procedure through each of the phases A, B and C of the input. It then enters a zero or offset determining routine wherein the sample inputs essentially are brought to a zero value and introduced to the phase multiplexer 326 as applied from lines 328 and 332. Under the control of the synchronous state machine via line grouping 352, the device carries out an initial ranging input for voltage and current through respective amplifiers 376 and 386 following which, range information is supplied to the latch 406 as well as to the address latch 408. Latch 406 then adjusts the gains of amplifiers 376 and 386 in accordance with the evaluated range and data sampling then takes place for the first of 360 samples. The range codes in RAM 424 then are multiplied with the data to provide an enhanced voltage or current evaluation and, for each of the 360 samples, the DSP 430 is interrupted by a DATA READY signal at line 432 such that zero interrupt data may be provided. These data are stored in onboard random access memory. At the termination of this zero routine on the part of the synchronous state machine, then an end of program signal is developed at line 508 extending from line grouping 352 of the state data expander 350. Line 508 is seen to extend to earlier-described line 340 which functions to reset the counters 336, 356 and 370 as well as to provide an end of program input pulse to the DSP 430. The synchronous state machine then enters the noted zero cross routine for commencing a next three phase and offset or zero setting evaluation.

Referring to FIGS. 4A–4C, a program flow chart for the synchronous state machine components as discussed in conjunction with FIG. 3A is set forth. This program also may be employed to operate a high speed general purpose digital signal processor as an alternative to the synchronous state machine aproach described above.

In general, the synchronous state components as described in conjunction with FIG. 3A operate in relative independence from the DSP 430 driven processing described in conjunction with FIG. 3B. A communication between these two functions occurs when the synchronous state machine indicates a DATA READY condition as described in FIG. 3A in conjunction with line 432. The DSP 430 functions to load calibration constants into RAM 424, whereupon the synchronous state machine is permitted to perform. At such time, the synchronous state machine is stopped so that the DSP 430 can take control of the data bus components 426-428.

FIG. 4A shows a zero cross routine region represented by vertical line 520. This initial portion of the routine is shown commencing at line 522 leading to the instructions represented at block 524. At this position, the synchronous state machine waits for a stop command of the DSP 430. In the event such a stop occurs for calibration constant loading into RAM 424, then at some point dictated by the DSP 430, the instant program recommences, as represented at line 526 and block 528 to carry out voltage conversion, as described in conjunction with phase A and analog-to-digital converter 382. This voltage conversion continues until such time as the zero cross detector network 400 detects a voltage phase A zero cross-over. Thus, the program proceeds as represented at line 530 and block 532 to provide the query as to whether a volt zero crossing has occurred. If it has not, then as represented by loop line 534, the program waits until such volt zero crossing has occurred. Where such crossing does occur as detected by the detector network 400, then as represented at line 536 the zero cross routine is exited and a multiply routine commences. The extent of this multiply routine is represented in the figures by vertical line 538.

Line 536 is seen to lead to the instructions at block 540. At this position, the volt and current range conversion is carried out by respective converters 382 and 392 to determine the scaling or range digital values as 12 bit outputs, including a sign bit. Accordingly, as represented at line 542 and block 544, these range values are stored, for example, in range latch 406 and range address latch 408. From range latch 408, scaling factors are addressed and accessed from RAM 424. Upon completing such storage, as represented at line 546 and block 548, the A/D converters are ranged by applying appropriate amplification gain input to amplifiers 376 and 386. Upon completion of ranging, as represented at line 550 and block 552, volt and current data conversions are carried out to provide 12 bits of data from each converter, the latter incorporating a sign bit. Following the conversion of volt and current data, as represented by line 554 and block 556, the range code or scaling factor is multiplied by the subsequently obtained amplitude (digital) values to derive an accurate, expanded voltage data valuation for the degree being sampled, which, for example, may have an extent as high as 21 significant bits. Then, as represented by line 558 and block 560 the resultant voltage data are multiplied by a gain and phase correction value again at the multiplier 418. Such values were inserted as calibration constants in RAM 424. The program then proceeds as represented at line 562 and block 564, the gain and phase correction voltage data are stored in RAM 424 and DSP 430 is interrupted with a DATA READY signal as described at line 432. Volt data then are made available for processing by DSP 430 in the manner thus far described in connection with FIG. 2B. Following such volt data submission, as represented at line 566 and block 568 the corrected volt data are withdrawn from RAM 424 and multiplied in squaring fashion at multiplier 418 to derive volt$^2$ data. Such data are submitted to the DSP 430 in conjunction with a DATA READY signal as provided from line 432. Thus, at this juncture, the DSP 430 is carrying out development of volthour data and volt$^2$ hour data. As represented at line 570 and block 572, the current range code is drawn from RAM 424 and multiplied with the second data conversion for current as provided from converter 392 to develop expanded current value data of high accuracy having a possible extent of 21 bits. Line 574 then shows the program leading to instructions for reading volt data from RAM 424 and multiplying it by the noted current data to provide watt data as shown at block 576. These watt data then are submitted to the DSP 430 in conjunction with a DATA READY signal from line 432. Line 578 shows the multiply routine then leading to the instructions of block 580 providing for the reading of volt data and multiplying it by current data under the conditions asserted by the var degree counter 490, providing for a 90 degrees or sample step delay. At the conclusion of the determination of var data, the DSP 430 is interrupted with a DATA READY signal from line 432 and the var data are read into it for the instant one degree sample. Line 582 shows the multiply routine continuing to the instructions at block 584 for developing Q data as a multiplication of current data by volt data delayed by 60 degrees or sampling steps to achieve a Q data valuation. These Q data are read into DSP 430 in conjunction with a DATA READY signal 432 and the multiply routine continues as represented at line 586. Line 586 leads to the instructions at block 588 providing for the reading of volt data and multiplying it by current data which, as described above, are developed only following the detection of a current zero cross-over by network 400. Upon completion of the multiplication, DSP 430 is provided these VA data in conjunction with a DATA READY signal at line 432 and the program continues as represented at line 590. Line 590 leads to a query as to whether 540 degrees have been sampled as represented at block 592. In the event of a negative determination, then the given phase of phases A, B or C has not been fully sampled 540 times and, as represented by loop line 594 the program returns to line 536 to await completion of the computation of all electrical parameters for a given phase full cycle of 360°.

In the event the determination of the inquiry at block 592 is in the affirmative, then as represented at line 596 and block 598, a determination is made as to whether three phases, A, B, and C have been evaluated to the extent of a full 540° cycle each. If that is not the case, then as represented by loop line 600 the program returns to line 522 (FIG. 4A) to again carry out the zero cross and multiply routines.

Where the inquiry at block 598 is in the affirmative, then as represented at line 602, the program enters the zero routine within the flow diagram region represented by vertical line 604. Line 602 leads to the instructions at block 606 wherein a watchdog synchronizing register is set. DSP 430 responds to this register to effect a synchronization by self-adjustment and the zero routine continues as represented at line 608 and block 610. Generally, the zero routine repeats the procedural steps which are carried out in performing a watt calculation. In this regard, block 610 shows that voltage and current range conversions are carried out at respective analog-to-digital converters 382 and 392. Thus, the scaling range data are obtained and, as represented at line 612 and block 614 the range codes are stored, following which, as represented at line 616 and block 618, the A-to-D converters 382 and 392 are appropriately ranged in consonance with the determined range codes by appropriate gain adjustments of respective amplifiers 376 and 386. Voltage and current data conversion then are carried out as represented at line 620 and block 622, whereupon, as represented at line 624 and block 626 the range code or scaling factors accessed from RAM 424 are multiplied by the data to achieve an accurate representation for the zeroing determination, which may have as many as 21 bits of voltage data. Similarly, as represented at line 628 and block 630 the same multiplication approach is carried out with respect to current data. The zero routine then continues as represented at line 632 and block 634 to provide for the multiplication of volt data by current data, following which the DSP 430 is interrupted with a DATA READY signal at line 432 to provide for storage of the zero offset data. As these data are stored, as represented at line 636, block 638 and line 640 an end-of-program enablement signal is passed to DSP 430 via lines 508 and 340. It may be recalled in conjunction with FIG. 3A that this signal also functions to reset the state counter 336, the degree counter 356, and the phase counter 370. The synchronous static machine then continues to repeat the program as represented by line 640 extending to line 522 (FIG. 4A).

Looking to FIGS. 5A–5G, a flow chart is revealed representing the program for the digital signal processor 430 as retained in memory 434. These figures should be considered in a mutual vertical orientation in the order of their alphabetical suffixes. As represented by the vertical region lines 650–653, the instant program is comprised of four component parts, a communications routine at 650, a read zero data routine at 651, a read six measured quantity data routine 652, and a process measured quantities and outputs routine 653.

FIG. 5A shows entry of the program with the communications routine 650 as commencing with a reset input from the electronic register 26 (FIG. 1) as asserted as described in FIG. 3B at line 464. This reset is shown entering the program at line 656 and is seen to function to provide a stop synchronous state machine instruction at block 658. The latter command shows a position in program where the synchronous state machine can be halted such that control of the bus components falls under DSP 430. This stop command corresponds with the wait for stop instruction at block 524 in FIG. 4A. Control of the bus components is established by the DSP 430, then as represented at line 660 and block 662, serial communication is established with the processor register 26 (FIG. 1) and magnitude and phase correction values are loaded by DSP 430 into the RAM 424 of the synchronous-state machine. It may be recalled that these correctional data are maintained in the register 26 on a non-volatile basis due to the use of an EPROM 32.

Following the loading of requisite constants into RAM 424, as represented at line 664 and block 666, the synchronous state machine is released and, as set forth in FIG. 4A at block 528, voltage conversion activities ensue and the synchronous state machine proceeds to block 606 at the commencement of its zero routine to set a watchdog synchronizing register. The DSP 430 awaits this position in the program as represented at line 668 and block 670 wherein a query is made as to whether the watchdog synchronous register has been set. In the event it has not been set, then as represented at loop line 672, the instant program awaits such activity prior to entering a read zero data routine. By so operating the synchronous state machine and ignoring the output, the machine in effect is cleared of spurious data and the like to assure accuracy at such time as viable readings commence to be taken.

When the watchdog register is set as represented at block 606 in FIG. 4C, the synchronous state machine program commences its zero routine represented at vertical line 604 while, simultaneously, the instant program commences to read the outputs of that routine. Thus, with an affirmative determination at block 670, as represented at line 672 and block 674, the program enables its interrupt for purposes of processing zero data as available and, in the meantime, as represented at line 676 and block 678 any output routines are serviced. However, when zero data are ready, the DSP 430 is interrupted with a DATA READY input as described in connection with line 432. Such an interrupt is shown at line 680 leading to block 682 providing for the reading of zero data as provided in conjunction with block 634 (FIG. 4C). Upon reading such zero data, as represented at line 684 and block 686, the interrupt register is set and, as represented at line 688, the interrupt routine returns. Prior to the interrupt, the service output routine as represented at block 678 continues as represented at line 690 and block 692 until such time as the above-discussed interrupt register is set. Until such time, as represented at line 694, the service routine loops awaiting the interrupt. Following the setting of the interrupt register, as represented at line 696 and block 698, the program changes the interrupt vector as it enters the read six measured quantity data routine. During this routine, the data comprised of volts, volts$^2$, watt, Q, var and volt amperes (VA) are read by DSP 430. Accordingly, as each of these interrupts occurs as described at blocks 564, 568, 576, 580, 584 and 588 in FIGS. 4A-4B, the measured quantity of data is read as represented at lines 700 and 702 leading to block 704 describing the reading of measured quantity data followed, as represented at line 706 and block 708 by the incrementing of the interrupt counter. Following such incrementation, as represented at line 710 and block 712, the interrupt is enabled and the routine returns as represented at line 714. Line 700 is shown leading to block 716 which functions to determine whether or not six interrupts have been received, in the event they have not, then as represented at loop line 718, the program dwells until such sixth interrupt occurs. Upon the occurrence of the sixth interrupt, as represented at line 720 and block 722 the program enters the processing of measured quantity output routine having now completed the reading of computed quantities.

Figure 6:
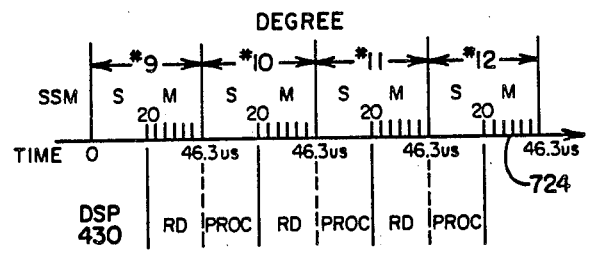
FIG. 6 is a diagrammatic time representation of the activities of the synchronous state machine with respect to the digital signal processor of the circuit of the apparatus of the invention.

Looking momentarily to FIG. 6, a time representation of the activities of the synchronous state machine (SSM) with respect to the digital signal processor (DSP) 430 is represented. Where sampling a 60 Hz signal, each degree or sample will persist for 46.3 microseconds as labelled above time line 724 in the figure. Above line 724 as labelled "SSM", as an example, a sequence of degrees, ranging from degree 9 through degree 12 are depicted. It may be observed that about one-half of the elapsed time of the sample degree interval will be taken up with the earlier-described sampling procedures as labelled "S". The remaining portion of the given degree interval will be involved with the earlier-described multiplication procedures of the SSM 430. DSP 430 commences the above-described reading procedure as represented at vertical line region 652 for about a period of time corresponding with the multiplication procedures of the same degree under analysis as labelled "RD". There then ensues the instant processing routine for the remainder of that sampled degree.

Returning to FIG. 5B, block 722 shows that the processing procedure carried out by DSP 430 commences with the adding of zero data to watt data following which, as represented at line 726 and block 728, a determination is made as to whether the sign bit of the watt valuation is 1 or 0. In the event that it is a 1, then as represented at line 730 and block 732 a watt polarity register is incremented and the program continues as represented at line 734. On the other hand, in the event the sign bit determination at block 728 shows a zero value, then as represented at line 736 and block 738 a decrementation of the watt polarity register is made and the program continues as represented at line 734. Generally, three register functions will be seen to be involved in the program, one serving to evolve the history of polarity as described in conjunction with blocks 732 and 738; register function accumulating data values, one for plus and one for minus in that regard; and a third register function that provides the earlier-described pulse forming overflow accounting.

Line 734 is seen extending to the input of block 740 wherein a query is made as to whether the watt polarity register is less than zero. In effect, this register is an up/down counter such that incremented or decremented it moves about a neutral zero value in either a positive or negative direction. A positive direction is one considered to be a history of 360 samples indicating that the power flow is "out" in the accepted commercial sense, while a corresponding history representing a negative valuation is considered a power flow in the "in" convention. Thus, where the query at block 740 shows that the polarity is not less than zero, then as represented at line 742 and block 744 the watt data are added to the watthour out output register and the program proceeds as represented at line 746. On the other hand, an affirmative response to the query at block 740 provides, as represented at line 748 and block 750, that the watt data are added to the watthour in output register and the program proceeds as represented at line 746. Line 746 then is seen leading to block 752 representing a servicing of the watthour out output routine for developing the earlier-noted pulsed output quantities. This is carried out by adding the data to an output register and, when that compiled data are above a predetermined threshold, pulses are outputted corresponding with watthours. The routine then proceeds as represented at line 752 and block 756 to determine whether or not the watthour in output function has been enabled. Such enablement will be at the election of the user, a total of six output channels being elected with the instant circuit architecture. In the event watthours have been enabled, then as represented at line 758 and block 760 the watthour in output routine is serviced as described in conjunction with watthour out at block 752. The routine then proceeds as represented at line 762. In the event of a negative determination at block 756, then as represented at line 764, this servicing is ignored and the routine progresses to the inquiry at block 766 for a determination as to whether the Qhour out feature has been enabled. In the event that it has, then as represented at line 768 and block 770, the zero offset data is added to the Q data and, as represented at line 772 and block 774 a determination is made as to whether the watt polarity register is less than zero. As before, this provides a historical determination as to the direction of power flow. In the event the determination at block 774 shows the polarity to be less than zero, then as represented at line 776 and block 778, the Q data are added to the Qhour out output register and the program proceeds as at line 780. On the other hand, where the inquiry at block 774 indicates that the polarity is greater than zero, then as represented at line 782 and block 784, the Q data are added to the Q hour in output register and the routine proceeds as at line 780 to the instructions at block 786. These instructions provide for the servicing of the Qhour out output routine in the manner described in conjunction with block 752 above. The routine then continues as represented at line 788 to the inquiry at block 790 wherein a determination is made as to whether the Qhour in feature has been enabled at the behest of the user. In the event that it has, then as represented at line 792 and block 794 the Qhour in output routine is serviced as above-described and the program proceeds as at line 796. In the event the determination at line 790 is in the negative, then as represented at line 798 the routine proceeds to the inquiry at block 800.

Returning to the inquiry at block 766, in the event the Qhour out feature of the system is not elected by the user, then as represented at line 802 the routine skips to the input to the instantly considered inquiry at block 800 determining whether or not a varhour lag out feature has been enabled in conjunction with election by the user. In the event that it has, then as represented at line 804 and block 806 zero offset correction data are added to the var data and the routine continues as represented at line 808 to the inquiry at block 810. Thus, four quadrant varhour metering procedures are undertaken. In this regard, the inquiry at block 810 determines whether the var sign bit is a 1 or a 0. In the event it is a 1, then as represented at line 812 and block 814, the var polarity register is incremented and the program proceeds as represented at line 816. On the other hand, where the var sign bit is a zero, then as represented at line 818 and block 820, the var polarity register is decremented and the program proceeds ia line 816 to the inquiry represented at block 822. At block 822, a determination is made as to whether the var polarity register is valued below zero. In the event that it is not, then as represented at line 824 and block 826, power flow is determined with respect to the condition of the watt polarity register. Where that condition is less than zero, then as represented at line 828 and block 830, the var data are added to the varhour lag out output register and the routine continues as represented at line 832. Where the determination at block 826 is in the affirmative, then as represented at line 834 and block 836, the var data are added to the varhour lead in output register and the routine continues as at line 832. Returning to block 822, where the var polarity register is less than zero, then as represented at line 838 and block 840, a determination is made again as to whether the watt polarity register is less than zero. In the event of a negative determination, as represented at line 842 and block 844, the var data are added to the varhour lead out output register and the routine continues as at line 832. On the other hand, where the determination at block 840 shows an affirmative determination, then as represented at line 846 and block 848, the var data are added to the varhour lag in output register and the routine continues as at line 832. Line 832 is seen then leading to block 850 representing a servicing of the varhour lag out output routine, that parameter having been determined to be enabled earlier in conjunction with block 800. As before, this servicing involves the determination as to whether quantity numerical values have reached a threshold value in register so as to evolve a pulse output representing a time based integration. The routine then continues as represented at line 852 and block 854 to a determination as to whether varhour lead out has been enabled. In the event that it has, then as indicated at line 856 and block 858, the varhour lead out output routine is serviced in the manner described in conjunction with block 850. The routine then continues as represented at line 860. In the event the determination at block 854 is in the negative, then as represented by line 862 the program continues to the determination at block 864. At the latter block, a determination is made as to whether the varhour lag in feature has been enabled in consonance with the desires of the user. In the event that it has, then as represented at line 866 and block 868, the varhour lag in output routine is serviced as described in the above service procedures. The routine then proceeds as represented at line 870. Where the determination at block 864 is in the negative, then as represented by line 872, the routine continues to the determination at block 874 querying whether the varhour lead in feature has been enabled in consequence of the user requirement. Where that is the case, then as represented at line 876 and block 888, the varhour lead in output routine is serviced to provide a pulse categorized data output and the routine continues as at line 890. Where the determination at block 874 is in the negative, then as represented at line 892, the routine continues without servicing procedures. Returning to FIG. 5D, where the determination at block 800 that varhour lag out features have not been enabled, then it is the design of the program that the user will not have requested further var data. Accordingly, as represented at line 894, the routine jumps to line 890 and the next inquiry at block 896 wherein a determination as to whether VAhour out has been enabled is made. Where that is the case, then as represented at line 898 and block 900, the zero offset data are added to VA data and the routine continues as represented by line 902 to the inquiry represented at block 904. At this position, a determination is made as to whether the watt polarity register is less than zero. In the event it is not, then as represented at line 906 and block 908, the VA data are added to the VAhour out output register and the routine proceeds as indicated at line 910. On the other hand, where the watt polarity register indicates a value less than zero representing a power flow towards the utility, then as represented at line 912 and block 914, the VA data are added to the VAhour in output register and the routine proceeds as at line 910 to the instructions at block 916 providing for the servicing of the VAhour output routine in the above-discussed manner wherein values are added to a cumulative register and the overflow above a given threshold therein is employed to produce a pulse categorized output.

The routine then proceeds as represented at line 918 to the inquiry at block 920 wherein a determination is made as to whether the VAhour in output category has been elected by the user. In the event that it has, then as represented at line 922 and block 924, the VAhour in output routine is serviced in the manner above-discussed and the routine continues as at line 926. Where the determination is in the negative at block 920, then as represented at block 928, the routine continues to a determination as represented at block 930 concerning volthours.

Returning momentarily to FIG. 5E, it may be observed that where the determination at block 896 has been made that the VAhour out parameter has not been enabled, then as represented at line 932 the routine skips to the volthour determination routine commencing with block 930 querying as to whether volthour parameters have been elected by the user as by enablement in the program. Where that is the case, then as represented at line 934 and block 936, the volt data are added to the volthour output register and, as represented at line 938 and block 940 the volthour output routine is serviced to generate a pulse categorized output signal and the routine continues as at line 942.

Where the determination at block 930 is in the negative, then the routine jumps as represented by line 944 to line 942 and the query at block 946 determining whether the volt$^2$ hour parameter has been enabled in accordance with user desire. Where it has, then as represented at line 948 and block 950 the volt$^2$ data are added to the volt² hour output register and, as represented at line 954 and block 955 the volt² hour output routine is serviced to generate a pulse categorized output for the register 26. The routine then continues as represented at line 956. Where the determination at block 946 is in the negative, then as represented at line 958, the program path, in turn, loops as represented at line 956 to the inquiry at block 960 shown in FIG. 5A determining whether or not the watchdog synchronous register has been set. In the event that it has not, then, as represented at line 962, the DSP program continues with the reading of six more measured quantities of data and proceeds to process such data. On the other hand, where the watchdog synchronizing register has been set, then as represented at line 964, the program returns to change the interrupt vector as represented at block 965. The program then returns to enable the interrupt as represented by line 967 leading to block 674 and continues as above-described.

The implementation of the programs described in conjunction with FIGS. 5 and 6 can be provided with other computational or processing devices than those heretofore described. For example, as more advanced general purpose digital signal processors become available, they can be substituted, particularly for the synchronous state machine heretofore described. One such device identified as a 56-bit general purpose DSP marketed under Model No. DSP56001 by Motorola, Inc. features 512 words of full speed on-chip program RAM memory, to preprogram data ROMs and special on-chip bootstrap hardware to permit convenient loading of user programs into the program RAM. A co-feature of the device is to provide for 10.25 million instructions per second (MIPS). Looking to FIG. 7, the implementation of such device is portrayed in general at 970 in block schematic form. One such DSP device which substitutes for the synchronous state machine earlier described is represented at block 972. The DSP 972 receives the 11 bits of data and a sign bit along bus 974 an provides control outputs as represented in general at line grouping 976. One such control is represented as lines 978 and 980 extending as controls to a voltage phase multiplexer 982 and a current phase multiplexer 984. Note that voltage analog inputs for phases A, B and C as well as a zeroing input, Z, are introduced via line grouping 986 to multiplexer 982, while, correspondingly, scaled current analog inputs for phases A, B and C along with a zero input, Z, are provided from along line grouping 988 to multiplexer 984.

Phase control is provided to the multiplexers 982 and 984 via respective lines 980 and 978 and the analog signals are presented therefrom via respective lines 990 and 992 to respective variable gain amplification stages 994 and 996. As before, an initial ranging unity gain setting is provided at amplifiers 994 and 996 via controls represented at respective lines 998 and 1000 emanating from line grouping 976. The initial ranging conversion then is provided from stage 994 via line 1002 to analog-to-digital converter stage 1004 while, correspondingly, this initial ranging conversion for current is provided from stage 996 via line 1006 to analog-to-digital conversion stage 1008. Control to inverters 1004 and 1008 is provided from the DSP 972 as represented by respective lines 1010 and 1012. The outputs of these converters are shown being directed via lines 1014 and 974 to the RAM components of DSP 972 as 11 data bits plus a sign bit. The DSP 972 then functions to alter the gain values based upon amplitude range of the sampled signals by control asserted to stages 994 and 996 from respective lines 998 and 1000. A second conversion then takes place, with selectively amplified inputs from stages 994 and 996 to provide data conversions at converters 1004 and 1008. These data, again provided as 11 data bits and a sign bit are submitted to device 972 via lines 1014 and 974. The DSP 972 carries out cross-over detection, control and multiplication functions as described in conjunction with a synchronous state machine 20 to provide read-outs having as many as 21 significant data bits plus sign bits for processing by a similar DSP shown at 1016 via 24-bit bus 1018.

Control between DSP 972 and DSP 1016 is represented at line 1020, while the corresponding six channel output of the DSP 1016 representing pulse data is shown generally at line grouping 1022. These six line groupings provide KYZ relay outputs as represented at corresponding line grouping 1024 and are seen to be directed to an electronic register represented at block 1026. Register 1026 communicates in serial communications transfer relationship with DSP 1016 as represented at line 1028 and provides the earlier-noted features described in conjunction with electronic register 26 described in connection with FIG. 1. In this regard, a telephone linkage through an appropriate modem is represented at line 1030; an optical port for providing serial data change is provided as represented at line 1032; and a data transfer port such as an RS232 variety is represented at line 1034.

Since certain changes may be made in the above apparatus and method without departing from the scope of the invention herein involved, it is intended that all matter contained in the above description or shown in the accompanying drawings shall be interpreted as illustrative and not in a limiting sense.

We claim:

1. Apparatus for metering an electrical power supply, comprising:
   step-down means connectable with said supply for deriving first and second electrical parameter sample signals of given waveform amplitudes during corresponding given cycles of said supply;
   amplifier means having gain characteristics controllable in response to a gain control input for selectively amplifying said first and second sample signals to provide corresponding first and second scaled signals;
   converter means actuable for converting said first and second sample signals to corresponding first and second range digital values and subsequently actuable to convert said first and second scaled signal to corresponding first and second data digital values; and
   control means for actuating said converter means to derive said first and second range digital values and deriving corresponding first and second scaling factors, responsive to said first and second range digital values for providing said gain control input at predetermined scaling levels, for subsequently actuating said converter means to derive said first and second data digital values, said control means multiplying said first and second data digital values with respective said first and second scaling factors to provide first and second expanded data digital values within a range extending to at least about twenty-one binary bits, said control means being responsive to a predetermined commencement location of the said waveform of a said first electrical parameter sample signal for commencing said actuation of said converter means and subsequently effecting said actuation at predetermined, regular intervals, said control means including a parameter memory for selectively retaining said first expanded data digital values and responsive to effect a multiplication of each said parameter memory retained first expanded data digital value with a said second expanded data digital value from the sequence thereof developed following a delay selected to derive predetermined power parameter metering output data.

2. The apparatus of claim 1 in which said control means memory is addressable with respect to said first and second range digital values to provide said first and second scaling factors.

3. The apparatus of claim 1 in which said control means memory is addressable with respect to said first and second range digital values to provide said first and second scaling factors as predetermined ones of a select sequence thereof corresponding with a predetermined number of scaling levels.

4. The apparatus of claim 3 in which:
said memory retains eleven said scaling levels as said predetermined number.

5. The apparatus of claim 1 in which:
said control means includes memory is addressable with respect to said first and second range digital values to provide first and second scaling factors as predetermined ones of a select sequence thereof corresponding with a predetermined number of said scaling levels.

6. The apparatus of claim 1 in which said control means is responsive to a zero cross-over as said predetermined commencement location for commencing a said first electrical parameter sample signal given cycle to commence said actuation of said converter means.

7. The apparatus of claim 6 in which said control means actuates said converter means to provide 360 said first and second expanded data digital values for each said given cycle.

8. The apparatus of claim 1 in which said control means is responsive to a said predetermined commencement location commencing a given cycle of said first electrical parameter sample signal for commencing said converter means actuation to derive said first expanded digital data values from first to last, and is responsive to a corresponding commencement location commencing a said given cycle of said second electrical parameter sample signal for effecting a said multiplication of said second expanded digital data values from first to last with corresponding first to last said first expanded digital data values retained in said parameter memory to derive said predetermined metering output data as volt-amperes.

9. The apparatus of claim 1 including:
register means responsive to said predetermined metering output data for effecting a display thereof, and including nonvolatile memory for retaining magnitude/phase correction values for effecting calibration correction of each said first expanded data digital value;
said control means communicating with said register means memory and including random access memory for receiving said magnitude/phase correction values and responsive to multiply each said first expanded data digital value by said memory retained correction value.

10. Apparatus for metering a polyphase power supply of waveform exhibiting voltage and current electrical parameters of given amplitudes within cycles defined by cycle envelopes, comprising:
step-down means connectable with said supply for deriving first and second electrical parameter sample, signals of amplitudes corresponding with said given amplitudes;
conversion means responsive to said first and second electrical parameter sample signals and actuable to derive respective first and second digital data values corresponding with said given amplitudes and having a range extending to at least about twenty-one binary bits;
sampling control means for actuating said conversion means to effect said derivation of first and second digital data values at a predetermined regular sampling rate commencing at a predetermined commencement location of said cycle envelope of said first electrical parameter sample signal and including memory means for selectively retaining said first digital data values derived with each said actuation, responsive to effect a multiplication of said memory retained first digital data values and said second digital data values following selective power parameter defining delays to provide power parameter digital values with respect to each said conversion means actuation; and
processing means responsive to effect integration of a sequence of said power parameter digital values for deriving meter output signals.

11. The apparatus of claim 10 in which said sampling control means sampling rate is 360 said actuations with respect to a said cycle.

12. The apparatus of claim 10 in which:
said sampling control means is responsive to effect said multiplication of said first digital data value with a corresponding said second digital data value resulting from a common said actuation to provide a watt power parameter digital value; and
said sampling control means effects said multiplication of said memory retained first digital data value with a said second digital data value derived following a said power parameter defining delay representing 60° in phase from said commencement location of a said first parameter sample signal cycle to provide a Q power parameter digital value.

13. The apparatus of claim 10 in which:
said sampling control means is responsive to effect a multiplication of a said first digital data value with a corresponding said second digital data value resulting from a common said actuation to provide a watt power parameter digital value; and
said sampling control means effects said multiplication of said memory retained first digital data value with a said second digital data value derived following a said power parameter defining delay representing ninety degrees in phase from said commencement location of a said first parameter sample signal cycle to provide a VAR power parameter digital value.

14. The apparatus of claim 10 in which:
said sampling control means is responsive to the occurrence of a commencement location of said first electrical parameter sample signal cycle envelope to commence said actuation of said conversion means to derive said first digital data values from first to last for the extent of a said cycle of said first electrical parameter sample;

said sampling control means is responsive to the occurrence of a said commencement location of a said second electrical parameter sample signal cycle envelope to commence said actuation of said conversion means to derive said second digital data values from first to last for the extent of said cycle envelope of said second electrical parameter sample signal; and said sampling control means effects a said multiplication of said first to last second digital data values with corresponding said first to last first digital data values to provide volt ampere power parameter digital values.

15. The apparatus of claim 10 including:

zeroing means for providing a substantially zero amplitude calibration sample input;

said conversion means is responsive when actuated in the presence of said calibration sample input derive current and voltage offset digital values derived from said step-down means and said conversion means;

said sampling control means actuates said conversion means at predetermined intervals to effect said derivation of current and voltage offset digital values at said sampling rate, and effects multiplications of said current and voltage offset digital values to provide power parameter offset digital values; and said processing means is responsive to sum said power parameter offset digital values with said power parameter digital values to effect offset correction thereof.

16. The apparatus of claim 10 in which said sampling control means is responsive to the said occurrence of said commencement location to commence said actuation of said conversion means with respect to each phase of said polyphase supply.

17. The method of metering a power supply of waveform exhibiting current and voltage electrical parameters of given amplitudes within cycles defined by cycle envelopes, comprising the steps of:

monitoring said supply to provide first and second electrical parameter sample signals of amplitudes corresponding with said given amplitudes;

converting said first and second electrical parameter sample signals to respective first and second binary range values at a predetermined regular sampling rate commencing upon the occurrence of predetermined commencement locations of select said cycle envelopes;

deriving first and second scaling factors for each respective said first and second binary range value;

amplifying said first and second electrical parameter sample signals at gains corresponding with respective said first and second binary range values;

converting said amplified first and second electrical parameter sample signals to respective first and second binary data values at said predetermined regular sampling rate;

multiplying said first and second binary data values with respective said first and second scaling factors to derive corresponding first and second expanded binary data values within a range extending to at least about twenty-one binary significant bits;

selectively multiplying said first and second expanded binary data values together to derive predetermined metering outputs; and displaying said metering outputs.

18. The method of claim 17 in which said predetermined sampling rate is 360 samples per cycle.

19. The method of claim 17 in which said step of converting said first and second electrical parameter sample signals is commenced with said zero cross-over of said first electrical parameter.

20. The method of claim 17 in which said step of selectively multiplying said first and second expanded binary data values is carried out by multiplying each first expanded binary data value derived from first to last for a cycle thereof commencing with said commencement location thereof with each corresponding second expanded binary data values derived from first to last for a cycle thereof commencing with said commencement location thereof to provide a volt-ampere said metering output.

21. The method of claim 17 in which said selective multiplication is carried out by retaining said first expanded binary data values for an interval corresponding with the occurrence of 60 degrees of a said cycle thereof, then commencing said selective multiplication of said retained first expanded binary data values, from first to last with the current said second expanded binary data values to provide a Q said metering output.

22. The method of claim 17 in which said selective multiplication is carried out by retaining said first expanded binary data values for an interval corresponding with the occurrence of 90 degrees of a said cycle thereof, then commencing said selective multiplication of said retained first expanded binary data values, from first to last with the current said second expanded binary data values to provide a VAR said metering output.

23. Apparatus for metering an electrical power supply, of waveform exhibiting voltage and current electrical parameters of given amplitudes within cycles defined by cycle envelopes, comprising:

step-down means connectable with said supply for deriving current and voltage sample inputs of given cycle and amplitude characteristics for each phase and exhibiting predetermined gain and phase error values;

conversion means responsive to said current and voltage sample inputs and actuable to derive respective current and voltage digital data values corresponding with said given amplitude characteristics and having a range extending to at least about twenty-one binary bits;

memory means for retaining correction values corresponding with said gain and phase error values;

sampling control means for actuating said conversion means to effect said derivation of said current and voltage digital data values as discrete samples commencing at a predetermined commencement location of said cycle envelope of said voltage sample input, for accessing said memory means correction values and effecting a correction of said digital data values with respect thereto, and for selectively retaining said voltage and current digital data values derived with each said actuation within said memory means, responsive to effect a multiplication of said memory retained voltage digital data values and said current digital data values following selective power parameter defining delays to provide power parameter digital values with respect to each said conversion actuation; and processing means responsive to effect integration of a sequence of said power parameter digital values for deriving meter output signals, 24. The apparatus of claim 23 in which said memory means retains said correction values as correction factors; and said sampling control means effects said correction as a product of a said correction factor and a said digital data value.

25. The apparatus of claim 23 in which said sampling control means actuates said conversion means at a predetermined, regular sampling rate.

26. Apparatus for metering a polyphase power supply, comprising:

step-down means connectable with said supply for deriving current and voltage sample inputs of given cycle, amplitude and phase characteristics;

conversion means responsive to said current and voltage sample inputs and actuable to derive respective current and voltage digital data values corresponding with said given amplitude characteristics;

sampling control means for actuating said conversion means to effect said derivation of current and voltage digital data values at a regular sampling rate of 360 said actuations with respect to a said given cycle, for effecting select multiplications of said data values to provide power parameter digital values with respect to each said conversion means actuation, including memory means for selectively retaining said voltage digital data values derived with each said actuation, responsive to effect a multiplication of a first voltage digital data value with a corresponding first current digital data value resulting from a common said actuation to provide a watt power parameter digital value, and effecting a said multiplication of said memory retained first voltage digital data value with a sixtieth said current digital data value derived sixty said actuations subsequent to the actuation deriving said first voltage digital data value to provide a Q power parameter digital value; and processing means responsive to effect integration of a sequence of said power parameter digital values for deriving meter output signals.

27. Apparatus for metering a polyphase power supply, comprising:

step-down means connectable with said supply for deriving current and voltage sample inputs of given cycle, amplitude and phase characteristics;

conversion means responsive to said current and voltage sample inputs and actuable to derive respective current and voltage digital data values corresponding with said given amplitude characteristics;

sampling control means for actuating said conversion means to effect said derivation of current and voltage digital data values at a regular sampling rate of 360 actuations with respect to a said given cycle for effecting select multiplications of said data values to provide power parameter digital values with respect to each said conversion means actuation, memory means for selectively retaining said voltage and current digital data values derived with each said actuation, responsive to effect said multiplication of a first said voltage digital data value with a corresponding first said current digital data value resulting from a common said actuation to provide a watt power parameter digital value, and said sampling control means effecting a multiplication of said memory retained first voltage digital data value with a ninetieth said current digital data value derived ninety said actuations subsequent to the actuation deriving said first voltage digital data value to provide a VAR power parameter digital value; and processing means responsive to effect integration of a sequence of said power parameter digital values for deriving meter output signals.

28. The method of metering a power supply of waveform exhibiting current and voltage electrical parameters of given amplitudes within cycles defined between zero cross-overs, comprising the steps of:

monitoring said supply to provide first and second said electrical parameter sample signals of amplitudes corresponding with said given amplitudes;

converting said first and second electrical parameter sample signals to respective first and second binary range values at a predetermined sampling rate and commencing with a said zero cross-over of said first electrical parameter;

deriving first and second scaling factors for each respective said first and second binary range value;

amplifying said first and second electrical parameter sample signals at gains corresponding with respective said first and second binary range values;

converting said amplified first and second electrical parameter sample signals to respective first and second binary data values;

multiplying said first and second binary data values with respective said first and second scaling factors to derive corresponding first and second expanded binary data values;

selectively multiplying said first and second expanded binary data values together to derive predetermined metering outputs; and displaying said metering outputs.

29. The method of metering a power supply of waveform exhibiting current and voltage electrical parameters of given amplitudes within cycles defined by zero cross-overs, comprising the steps of:

monitoring said supply to provide first and second said electrical parameter sample signals of amplitudes corresponding with said given amplitudes;

converting said first and second electrical parameter sample signals to respective first and second binary range values at a predetermined sampling rate;

deriving first and second scaling factors for each respective said first and second binary range value;

amplifying said first and second electrical parameter sample signals at gains corresponding with respective said first and second binary range values;

converting said amplified first and second electrical parameter sample signals to respective first and second binary data values;

multiplying said first and second binary data values with respective said first and second scaling factors to derive corresponding first and second expanded binary data values;

multiplying each first expanded binary data value derived from first to last for a cycle defined between said zero cross-overs with each corresponding second expanded binary data values derived from first to last for a cycle defined between said zero cross-over to provide a volt-ampere said metering output; and displaying said metering output.

30. The method of metering a power supply of waveform exhibting current and voltage electrical parameters of given amplitudes within cycles defined by zero cross-overs, comprising the steps of:
monitoring said supply to provide first and second said electrical parameter sample signals of amplitudes corresponding with said given amplitudes;
converting said first and second electrical parameter sample signals to respective first and second binary range values at a sampling rate of 360 samples per cycle;
deriving first and second scaling factors for each respective said first and second binary range value;
amplifying said first and second electrical parameter sample signals at gains corresponding with respective said first and second binary range values;
converting said amplified first and second electrical parameter sample signals to respective first and second binary data values;
multiplying said first and second binary data values with respective said first and second scaling factors to derive corresponding first and second expanded binary data values;
retaining said first expanded binary data values for an interval corresponding with 60 said samples, then commencing selective multiplication of said first expanded binary data values, from first to last for a given said cycle, with said second expanded binary data values to provide a Q output; and
displaying said output.

31. The method of metering a power supply of waveform exhibiting current and voltage electrical parameters of given amplitudes within cycles defined by zero cross-overs, comprising the steps of:
monitoring said supply to provide first and second said electrical parameter sample signals of amplitudes corresponding with said given amplitudes;
converting said first and second electrical parameter sample signals to respective first and second binary range values at a sampling rate of 360 samples per cycle;
deriving first and second scaling factors for each respective said first and second binary range value;
amplifying said first and second electrical parameter sample signals at gains corresponding with respective said first and second binary range values;
converting said amplified first and second electrical parameter sample signals to respective first and second binary data values;
multiplying said first and second binary data values with respective said first and second scaling factors to derive corresponding first and second expanded binary data values;
retaining said first expanded binary data values for an interval corresponding with 90 said samples, then commencing multiplication of said first expanded binary data values, from first to last for a given cycle, with said second expanded binary data values to provide a VAR output; and
displaying said output.

32. The method of metering a power supply of waveform exhibiting current and voltage electrical parameters of given amplitudes within cycles defined by cycle envelopes comprising the steps of:
monitoring said supply to provide first and second electrical parameter sample signals of amplitudes corresponding with said given amplitudes;
converting said first and second electrical parameter sample signals, commencing upon the occurrence of a predetermined commencement location of said cycle envelope of said first parameter sample signal, to respective first and second binary data values each exhibiting a range of significant bits extending to at least about twenty-one, at a predetermined regular sampling rate;
retaining said first binary data values in memory for delay intervals selected for deriving select power parameter digital values;
multiplying concurrently developed said first and second binary data values to derive watt digital values;
multiplying said second binary data values with said memory retained first binary data values following a predetermined delay to derive a said select power parameter digital value;
accumulating a sequence of said watt digital values to derive watthour meter output signals; and
accumulating a sequence of said select power parameter digital values to derive corresponding select meter output signals.

33. The method of claim 32 in which said predetermined delay in said multiplication of said second binary data value is selected to effect coincidence of the cycle envelope within which said second binary data values are derived and the corresponding cycle envelope within which said memory retained first binary data values are derived to provide a volt-ampere power parameter.

34. The method of claim 33 in which said coincidence is effecte by commencing said multiplication upon the zero cross-over of the waveform of said second electrical parameter signal.

35. The method of claim 32 in which said predetermined delay in said multiplication of said second binary data value is selected as an interval corresponding with the occurrence of 60 degrees of a said cycle commencing with the occurrence of said predetermined commencement location to provide a Q power parameter.

36. The method of claim 32 in which said predetermined delay in said multiplication of said second binary data value is selected as an interval corresponding with the occurrence of 90 degrees of a said cycle commencing with the occurrence of said predetermined commencement location to provide a VAR power parameter.

37. Apparatus for metering an electrical power supply, comprising:
step-down means connectable with said supply for deriving first and second electrical parameter sample signals of given amplitudes during corresponding given cycles of said supply;
amplifier means having gain characteristics controllable in response to a gain control input for selectively amplifying said first and second sample signals to provide corresponding first and second scaled signals;
converter means actuable for converting said first and second sample signals to corresponding first and second range digital values and subsequently actuable to convert said first and second scaled signals to corresponding first and second data digital values; and
control means responsive in the presence of a zero cross-over commencing said first electrical parameter sample signal given cycle for commencing the actuation of said converter means to derive said first and second range digital values and deriving corresponding first and second scaling factors, responsive to said first and second range digital values for providing a gain control input at predetermined scaling levels, for subsequently actuating said converter means to derive said first and second data digital values, said control means multiplying said first second data digital values with respective said first and second scaling factors to provide first and second expanded data digital values, said control means effecting said actuations at predetermined, substantially regular intervals, and effecting a select multiplication of said first and second expanded data digital values to derive predetermined metering outputs.

38. The apparatus of claim 37 in which said control means actuates said converter means to provide 360 said first and second expanded data digital values for each said given cycle.

39. Apparatus for metering an electrical power supply, comprising:
step-down means connectable with said supply for deriving first and second electrical parameter sample signals of given amplitudes during corresponding given cycles of said supply;
amplifier means having gain characteristics controllable in response to a gain control input for selectively amplifying said first and second sample signals to provide corresponding first and second scaled signals;
converter means actuable for converting said first and second sample signals to corresponding first and second range digital values and subsequently actuable to convert said first and second scaled signals to corresponding first and second data digital values; and
control means for actuating said converter means to derive said first and second range digital values and corresponding first and second scaling factors, responsive to said first and second range digital values for providing a gain control input at predetermined scaling levels, for subsequently actuating said converter means to derive said first and second data digital values, said control means multiplying said first and second data digital values with respective said first and second scaling factors to provide first and second expanded data digital values, said control means being responsive in the presence of a zero cross-over commencing a said given cycle of said first electrical parameter sample signal for commencing said converter means actuation to derive said first expanded digital data values from first to last, and being responsive in the presence of a corresponding zero cross-over commencing a said given cycle of said second electrical parameter sample signal for effecting a multiplication of said second expanded digital data values from first to last with corresponding first to last said first expanded digital data values to derive predetermined metering outputs as volt-amperes.

40. Apparatus for metering an electrical poewr supply, comprising:
step-down means connectable with said supply for deriving first and second electrical parameter sample signals of given amplitudes during corresponding given cycles of said supply;
amplifier means having gain characteristics controllable in response to a gain control input for selectively amplifying said first and second sample signals to provide corresponding first and second scaled signals;
converter means actuable for converting said first and second sample signals to corresponding first and second range digital values and subsequently actuable to convert said first and second scaled signals to corresponding first and second data digital values; and
control means for actuating said converter means to derive said first and second range digital values and corresponding first and second scaling factors, responsive to said first and second range digital values for providing a gain control input at predetermined scaling levels, for subsequently actuating said converter means to derive said first and second data digital values, said control means multiplying said first and second data digital values with respective said first and second scaling factors to provide first and second expanded data digital values, said control means effecting a select multiplication of said first and second expanded data digital values to derive predetermined metering outputs;
register means responsive to said predetermined metering outputs for effecting a display thereof, and including non-volatile memory for retaining magnitude/phase correction values for effecting calibration correction of said first expanded data digital values; and
said control means communicating with said register means memory and said control means including random access memory for receiving said magnitude/phase correction values and responsive to multiply said first expanded data digital values by said memory retained correction values.

41. Apparatus for metering a power supply, comprising:
step-down means connectable with said supply for deriving current and voltage sample inputs of given cycle, amplutide and phase characteristics;
conversion means responsive to said current and voltage sample inputs and actuable to derive respective current and voltage digital data values corresponding with said given amplitude characteristics;
sampling control means for actuating said conversion means to effect the derivation of current and voltage digital data values at a predetermined, regular sampling rate,
said sampling control means being responsive in the presence of a zero cross-over of a said voltage sample input to commence said actuation of said conversion means to derive said voltage digital data values from first to last for the extent of a said voltage sample input cycle,
said sampling control means being responsive in the presence of a zero cross-over of a said current sample input to commence said actuation of said conversion means to derive said current digital data values from first to last for the extent of a said current sample input cycle, and
said sampling control means effecting a multiplication of said first to last current digital data values with corresponding said first to last voltage digital data values to provide volt ampere power parameter digital values; and processing means responsive to effect integration of a sequence of said volt-ampere power parameter digital values for deriving meter output signals.

42. Apparatus for metering a power supply, comprising:

step-down means connectable with said supply for deriving current and voltage sample inputs of given cycle, amplitude and phase characteristics;

zeroing means actuable for providing a substantially zero amplitud calibration sample input;

conversion means responsive to said current and voltage sample inputs and actuable to derive respective current and voltage digital data values corresponding with said given amplitude characteristics, said conversion means being responsive when actuated in conjunction with said zeroing means to derive any current and voltage offset digital values resulting from the assertion of said calibration sample input sampling control means for actuating said conversion means to effect said derivation of current and voltage digital data values at a predetermined, regular sampling rate and for effecting select multiplications of said data values to provide power parameter digital values with respect to each said conversion means actuation, said sampling control means actuating said conversion means and said zeroing means at predetermined intervals to effect said derivation of current and voltage offset digital values in sampling correspondence with said actuation to derive said current and voltage digital values at said sampling rate, and deriving power parameter offset digital values; and processing means responsive to sum said power parameter offset digital values with said power parameter digital values to effect offset correction thereof, and responsive to effect integration of a sequence of said power parameter digital values for deriving meter output signals.

43. Apparatus for metering a polyphase power supply, comprising:

step-down means connectable with said supply for deriving current and voltage sample inputs of given cycle, amplitude and phase characteristics;

conversion means responsive to said current and voltage sample inputs and actuable to derive respective current and voltage digital data values corresponding with said given amplitude characteristics;

sampling control means for actuating said conversion means to effect said derivation of current and voltage digital data values at a predetermined, regular sampling rate and for effecting select multiplications of said data values to provide power parameter digital values with respect to each said conversion means actuation, said sampling control means being responsive in the presence of a zero crossover of said cycles of said voltage sample inputs to commence said actuation of said conversion means with respect to each phase of said polyphase supply; and processing means responsive to effect integration of a sequence of said power parameter digital values for deriving meter output signals.

* * * * *